United States Patent
Lee et al.

(10) Patent No.: US 11,626,417 B2
(45) Date of Patent: Apr. 11, 2023

(54) THREE-DIMENSIONAL SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Dong-Sik Lee, Hwaseong-si (KR); Byungjin Lee, Hwaseong-si (KR); Sung-Min Hwang, Hwaseong-si (KR)

(73) Assignee: Samsung Electronics Co, Ltd., Suwon-si (KR)

(*) Notice: Subject to any disclaimer, the term of this patent is extended or adjusted under 35 U.S.C. 154(b) by 191 days.

(21) Appl. No.: 17/113,456

(22) Filed: Dec. 7, 2020

(65) Prior Publication Data

US 2021/0225871 A1 Jul. 22, 2021

(30) Foreign Application Priority Data

Jan. 21, 2020 (KR) .................. 10-2020-0007787

(51) Int. Cl.
*H01L 27/11582* (2017.01)
*H01L 27/11556* (2017.01)
*H01L 27/11526* (2017.01)
*H01L 27/11573* (2017.01)
*H01L 27/11519* (2017.01)
*H01L 27/11565* (2017.01)

(52) U.S. Cl.
CPC .. *H01L 27/11582* (2013.01); *H01L 27/11519* (2013.01); *H01L 27/11526* (2013.01); *H01L 27/11556* (2013.01); *H01L 27/11565* (2013.01); *H01L 27/11573* (2013.01)

(58) Field of Classification Search
CPC .................................................. H01L 27/11582
See application file for complete search history.

(56) References Cited

U.S. PATENT DOCUMENTS

| | | | |
|---|---|---|---|
| 8,440,531 B2 | 5/2013 | Han et al. | |
| 8,884,357 B2 | 11/2014 | Wang et al. | |
| 9,520,406 B2 | 12/2016 | Makala et al. | |
| 9,576,967 B1 | 2/2017 | Kimura et al. | |
| 9,691,783 B2 | 6/2017 | Yoon | |
| 10,242,994 B2 | 3/2019 | Inomata et al. | |
| 10,283,493 B1 | 5/2019 | Nishida | |
| 10,346,088 B2 | 7/2019 | Righetti et al. | |
| 2011/0312174 A1 | 12/2011 | Lee et al. | |
| 2017/0179026 A1 | 6/2017 | Toyama et al. | |
| 2017/0345843 A1 | 11/2017 | Lee et al. | |
| 2017/0352678 A1* | 12/2017 | Lu | H01L 27/1157 |
| 2018/0240811 A1* | 8/2018 | Kim | H01L 27/11578 |
| 2018/0308858 A1 | 10/2018 | Hopkins et al. | |

* cited by examiner

*Primary Examiner* — Christopher A Johnson
(74) *Attorney, Agent, or Firm* — F. Chau & Associates, LLC

(57) ABSTRACT

A three-dimensional semiconductor memory device includes a substrate including cell and connection regions. An electrode structure is disposed on the substrate, the electrode structure having a staircase structure on the connection region. A first vertical channel structure and a first dummy structure at least partially penetrate the electrode structure on the cell region and the connection region, respectively. Bottoms of expanded portions of the first vertical channel structure and the first dummy structure are located at first and second levels, respectively. The second level is higher than the first level.

20 Claims, 34 Drawing Sheets

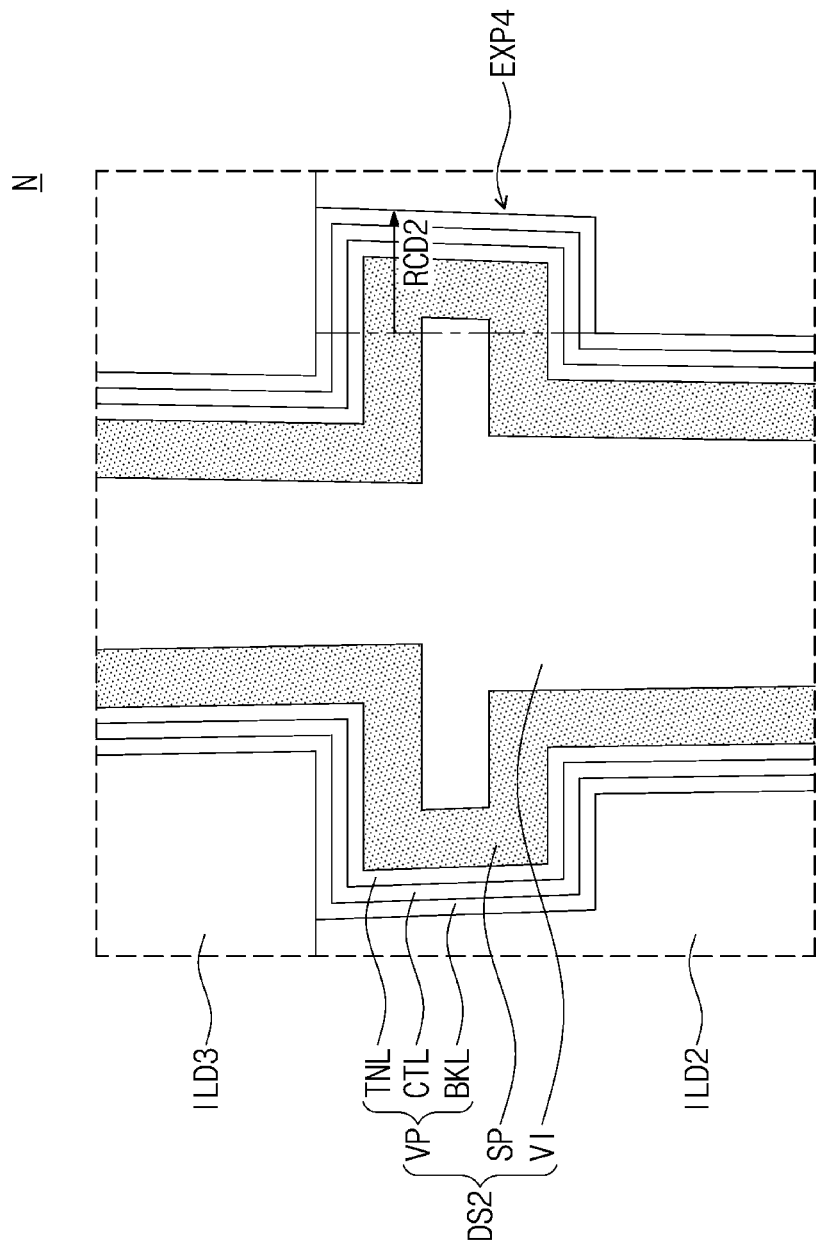

THREE-DIMENSIONAL SEMICONDUCTOR MEMORY DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2020-0007787, filed on Jan. 21, 2020, in the Korean Intellectual Property Office, the entire contents of which are hereby incorporated by reference.

TECHNICAL FIELD

The present disclosure relates to a semiconductor device and, more specifically, to a three-dimensional semiconductor memory device and a method of fabricating the same.

DISCUSSION OF THE RELATED ART

Higher integration of semiconductor devices may be used to satisfy consumer demands for superior performance and inexpensive prices. In traditional semiconductor devices, that may be referred to as two-dimensional or planar semiconductor devices, since their size is mainly determined by the area occupied by a unit memory cell, integration is greatly influenced how finely the patterns are formed. However, the cost of the equipment needed to increase pattern fineness sets a practical limitation on increasing integration for two-dimensional or planar semiconductor devices. To overcome such a limitation, semiconductor devices, such as semiconductor memory devices, may be made to include a stacked structure in which circuit components may be arranged in three-dimensions. These semiconductor devices may be referred to as three-dimensional semiconductor devices. Three-dimensional semiconductor memory devices may therefore include memory cells that are arranged with a stacked structure that extends in three-dimensions.

SUMMARY

According to an embodiment of the inventive concept, a semiconductor memory device includes a substrate including a cell region and a connection region, an electrode structure disposed on the substrate, the electrode structure having a staircase structure on the connection region, a first vertical channel structure at least partially penetrating the electrode structure on the cell region, and a first dummy structure at least partially penetrating the electrode structure on the connection region. The electrode structure includes a first electrode structure including first electrodes, which are stacked on the substrate, and a second electrode structure including second electrodes, which are stacked on the first electrode structure. Each of the first vertical channel structure and the first dummy structure includes a first vertical extended portion at least partially penetrating the first electrode structure, a second vertical extended portion at least partially penetrating the second electrode structure, and an expanded portion disposed between the first and second vertical extended portions. A bottom of the expanded portion of the first vertical channel structure is located at a first level, and a bottom of the expanded portion of the first dummy structure is located at a second level that is higher than the first level.

According to an embodiment of the inventive concept, a semiconductor memory device includes a substrate including a cell region, a connection region, and a cell edge region disposed between the cell region and the connection region, an electrode structure on the substrate, a first vertical channel structure at least partially penetrating the electrode structure on the cell region, and a second vertical channel structure at least partially penetrating the electrode structure on the cell edge region. The electrode structure includes a first electrode structure including first electrodes, which are stacked on the substrate, and a second electrode structure including second electrodes, which are stacked on the first electrode structure. Each of the first and second vertical channel structures includes a first vertical extended portion at least partially penetrating the first electrode structure, a second vertical extended portion at least partially penetrating the second electrode structure, and an expanded portion disposed between the first and second vertical extended portions. A vertical length of the expanded portion of the first vertical channel structure is greater than a vertical length of the expanded portion of the second vertical channel structure.

According to an embodiment of the inventive concept, a semiconductor memory device includes a substrate including a cell region and a connection region, an electrode structure on the substrate, the electrode structure having a staircase structure on the connection region, a first vertical channel structure at least partially penetrating the electrode structure on the cell region, and a first dummy structure at least partially penetrating the electrode structure on the connection region. The electrode structure includes a first electrode structure including first electrodes, which are stacked on the substrate, and a second electrode structure including second electrodes, which are stacked on the first electrode structure. Each of the first vertical channel structure and the first dummy structure includes a first vertical extended portion at least partially penetrating the first electrode structure, a second vertical extended portion at least partially penetrating the second electrode structure, and an expanded portion disposed between the first and second vertical extended portions. The largest width of the first vertical extended portion of the first vertical channel structure is a first width, the largest width of the expanded portion of the first vertical channel structure is a second width, the largest width of the first vertical extended portion of the first dummy structure is a third width, the largest width of the expanded portion of the first dummy structure is a fourth width, and a ratio of the second width to the first width is greater than a ratio of the fourth width to the third width.

According to an embodiment of the inventive concept, a method of fabricating a semiconductor memory device includes alternately stacking first insulating layers and first sacrificial layers on a substrate to form a first mold structure, the substrate including a cell region and a connection region, forming a channel hole to at least partially penetrate the first mold structure on the cell region, forming a dummy hole to at least partially penetrate the first mold structure on the connection region, forming a first sacrificial mask layer to fill the channel hole and the dummy hole, a level of a top surface of the first sacrificial mask layer increasing in a direction from the cell region to the connection region, recessing the first sacrificial mask layer to expose an upper portion of the channel hole and an upper portion of the dummy hole, expanding the upper portion of the channel hole and the upper portion of the dummy hole, and removing the first sacrificial mask layer and forming a second sacrificial mask layer to till the channel hole and the dummy hole.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 16A and 16B are enlarged cross-sectional views illustrating portions (e.g., the portions 'M' and 'N' of FIG. 4A) of a semiconductor memory device according to an embodiment of the inventive concept;

DETAILED DESCRIPTION

It should be noted that these figures are intended to illustrate the general characteristics of methods, structure and/or materials utilized in certain example embodiments and to supplement the written description provided below. These drawings need not be to scale and might not precisely reflect the precise structural or performance characteristics of any given embodiment, and need not be interpreted as defining or limiting the range of values or properties encompassed by example embodiments. For example, the relative thicknesses and positioning of molecules, layers, regions, and/or structural elements may be reduced or exaggerated for clarity. The use of similar or identical reference numbers in the various drawings may be intended to indicate the presence of a similar or identical element or feature.

Figure 1:
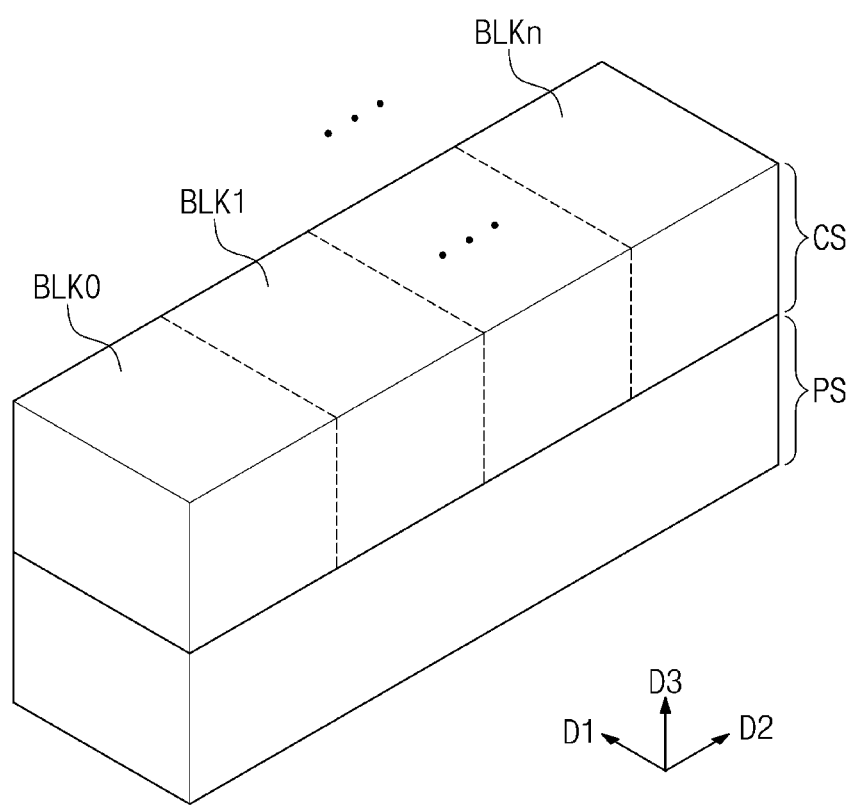
FIG. 1 is a schematic perspective view illustrating a three-dimensional semiconductor memory device according to an embodiment of the inventive concept.

FIG. 1 is a schematic perspective view illustrating a three-dimensional semiconductor memory device according to an embodiment of the inventive concept.

Referring to FIG. 1, a three-dimensional semiconductor memory device, according to an embodiment of the inventive concept, may include a peripheral circuit structure PS, a cell array structure CS disposed on the peripheral circuit structure PS, and a penetration contact vertically connecting the cell array structure CS to the peripheral circuit structure PS. In a plan view, the cell array structure CS may be overlapped with the peripheral circuit structure PS and may have widths and lengths that are at least similar to each other.

In an embodiment of the inventive concept, the peripheral circuit structure PS may include row and column decoders, a page buffer, control circuits, and peripheral logic circuits. The peripheral logic circuits constituting the peripheral circuit structure PS may be integrated on a semiconductor substrate.

The cell array structure CS may include a cell array, in which a plurality of memory cells are arranged in three dimensions. For example, the cell array structure CS may include a plurality of memory blocks BLK0-BLKn. Each of the memory blocks BLK0-BLKn may include memory cells, which are three-dimensionally arranged.

Figure 2:
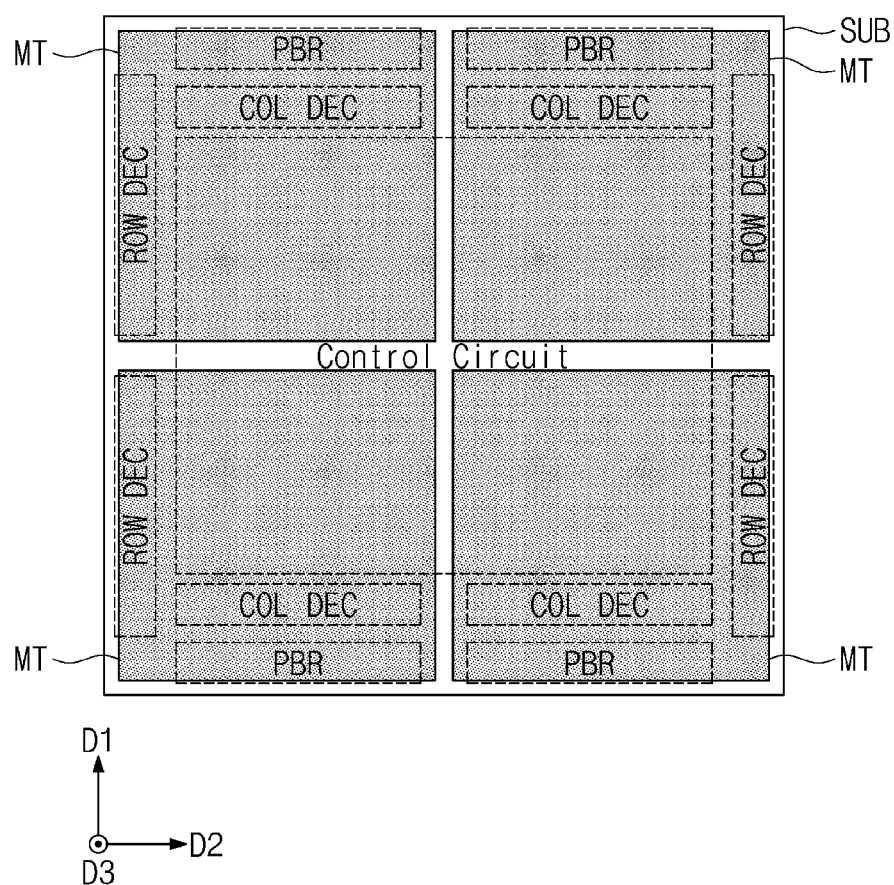
FIG. 2 is a schematic plan view illustrating a three-dimensional semiconductor memory device according to an embodiment of the inventive concept.

FIG. 2 is a schematic plan view illustrating a three-dimensional semiconductor memory device according to an embodiment of the inventive concept.

Referring to FIGS. 1 and 2, the peripheral circuit structure PS and the cell array structure CS described with reference to FIG. 1 may be disposed on a first substrate SUB. In each of chip regions 10, row and column decoders ROW DEC and COL DEC, a page buffer PBR, and control circuits, which constitute the peripheral circuit structure PS of FIG. 1, may be disposed on the first substrate SUB.

A plurality of mats MT constituting the cell array structure CS of FIG. 1 may be disposed on the first substrate SUB. The mats MT may be arranged in a first direction D1 and a second direction D2. Each of the mats MT may include the memory blocks BLK0-BLKn previously described with reference to FIG. 1.

The mats MT may be disposed to be overlapped with the peripheral circuit structure PS of FIG. 1. In an embodiment, the peripheral logic circuits constituting the peripheral circuit structure PS of FIG. 1 may be freely disposed below the mats MT.

Figure 3:
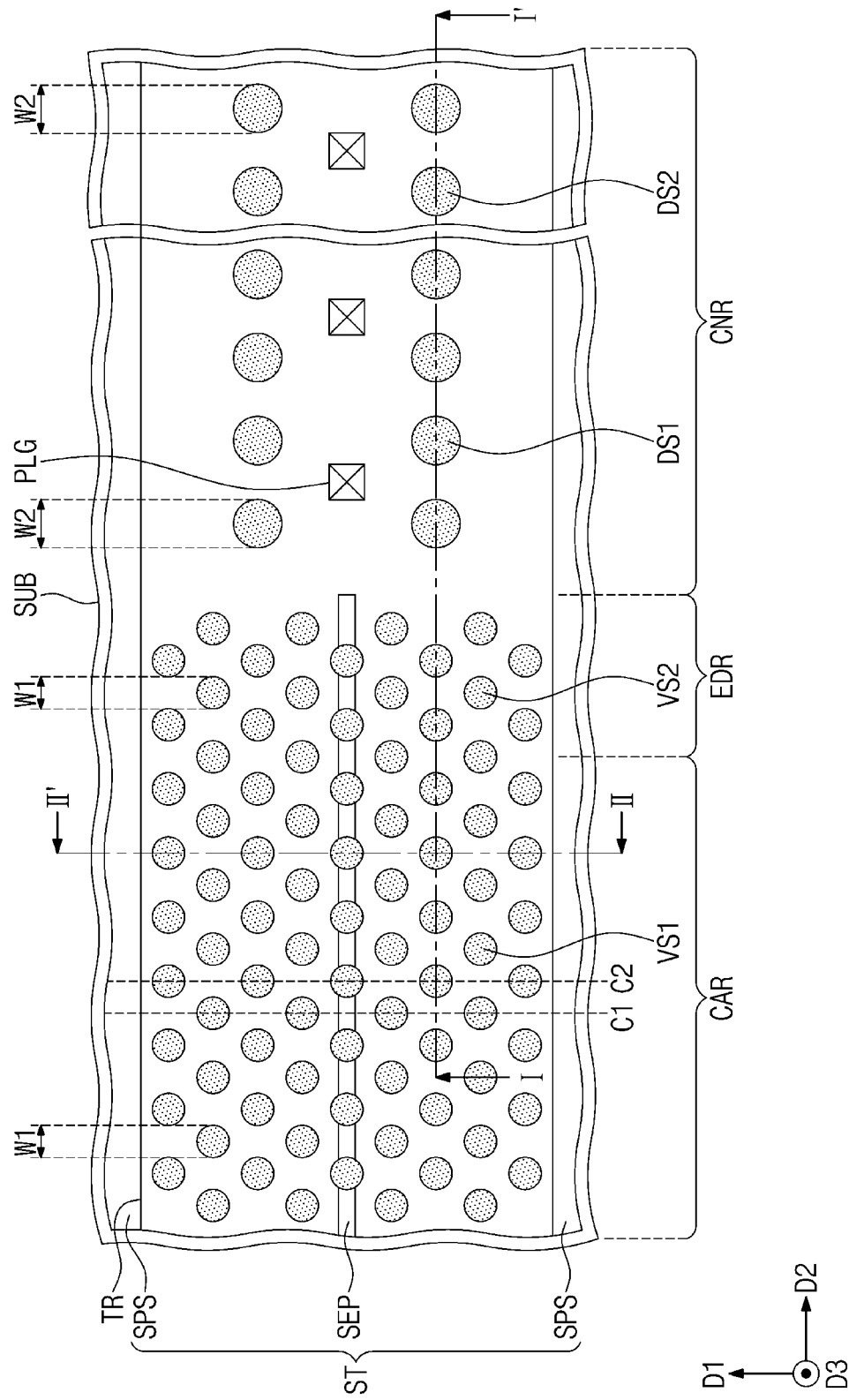
FIG. 3 is a plan view illustrating a three-dimensional semiconductor memory device according to an embodiment of the inventive concept.
Figure 4A:
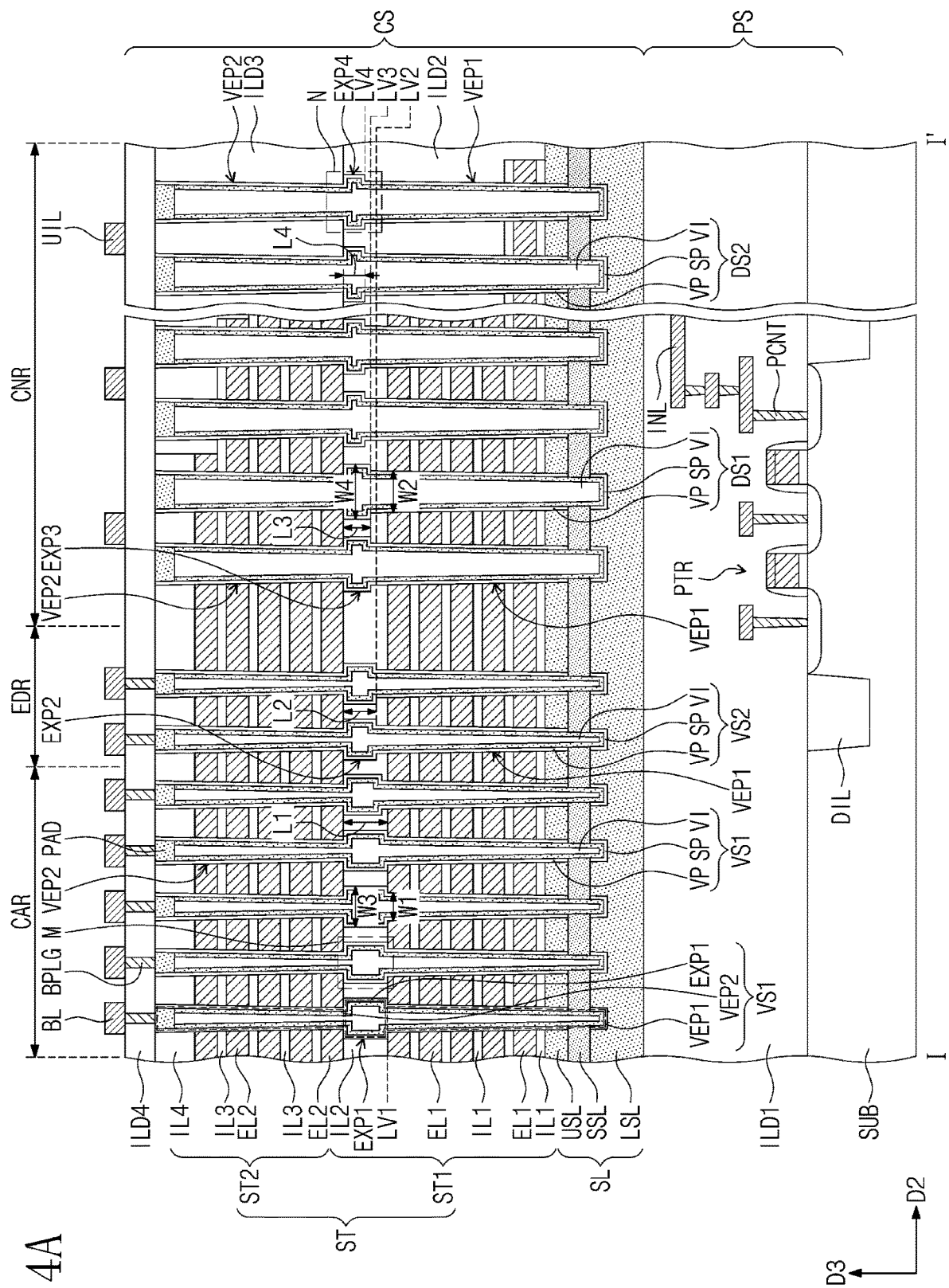
FIGS. 4A and 4B are cross-sectional views taken along lines I-I' and II-II', respectively, of FIG. 3.
Figure 4B:
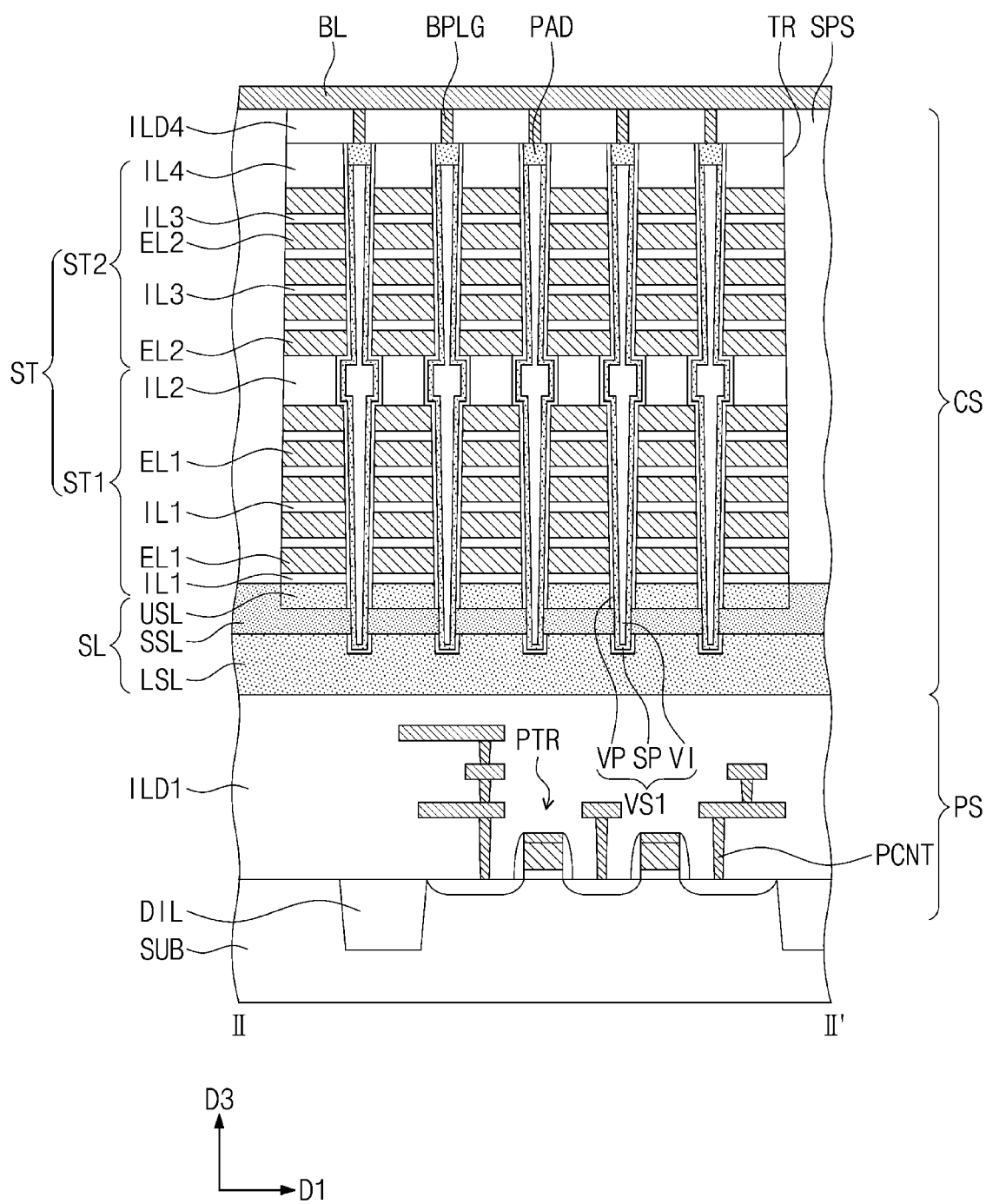
Figure 5A:
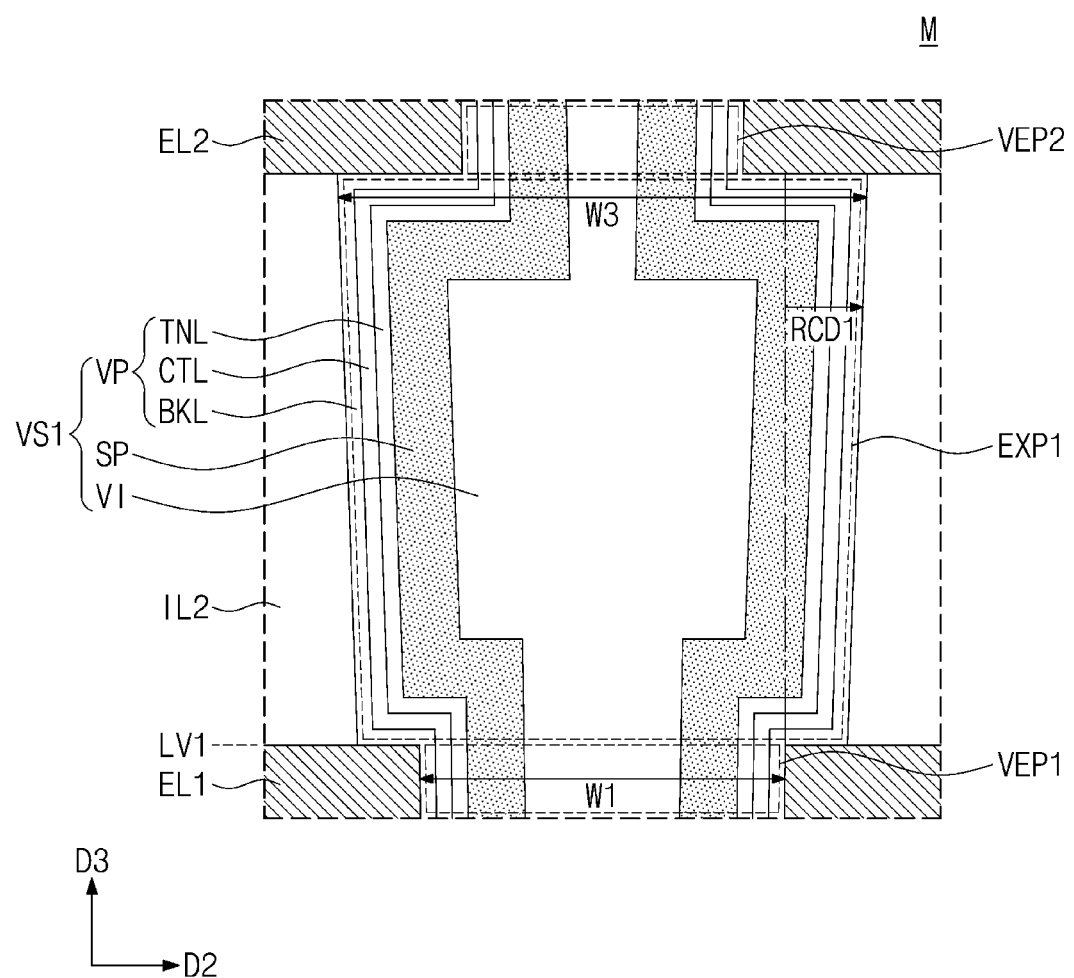
FIGS. 5A and 5B are enlarged cross-sectional views, which illustrates portions 'M' and 'N', respectively, of FIG. 4A.
Figure 5B:
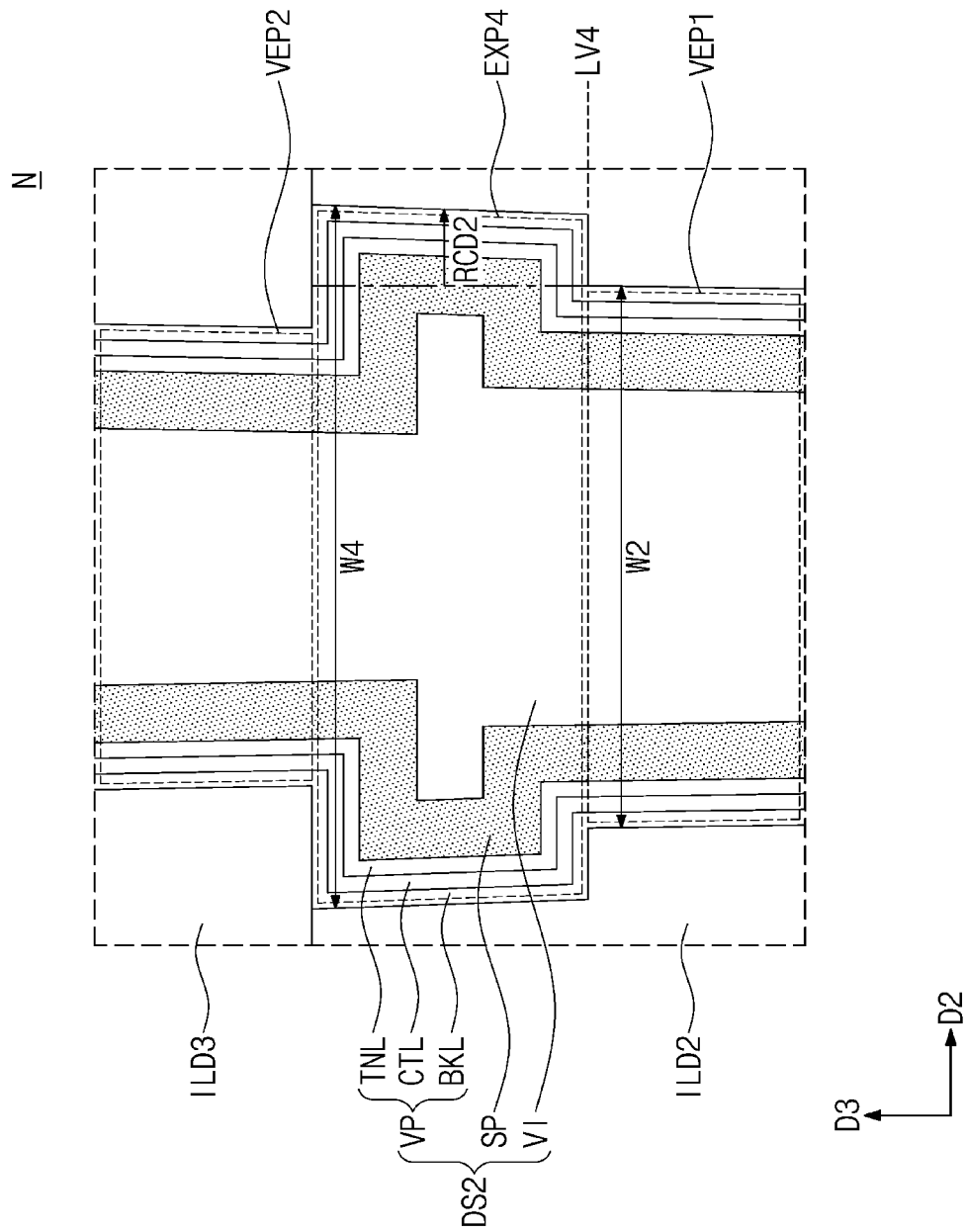

FIG. 3 is a plan view illustrating a three-dimensional semiconductor memory device according to an embodiment of the inventive concept. FIGS. 4A and 4B are cross-sectional views taken along lines I-I' and II-II', respectively, of FIG. 3. FIGS. 5A and 5B are enlarged cross-sectional views, which illustrates portions 'M' and 'N', respectively, of FIG. 4A. The semiconductor memory device of FIG. 3 illustrates an example of the memory cell structure in one of the mats MT shown in FIG. 2.

Referring to FIGS. 3, 4A, 4B, 5A, and 5B, the peripheral circuit structure PS, including peripheral transistors PTR, may be disposed on the first substrate SUB. The cell array structure CS, including an electrode structure ST, may be disposed on the peripheral circuit structure PS. The first substrate SUB may be a silicon substrate, a silicon-germanium substrate, a germanium substrate, or a single-crystalline epitaxial layer grown on a single crystalline silicon substrate. The first substrate SUB may include active regions defined by a device isolation layer DIL.

The peripheral circuit structure PS may include the peripheral transistors PTR, which are disposed on the active regions of the first substrate SUB. The peripheral transistors PTR may constitute the row and column decoders, the page buffer, the control circuit, and the peripheral logic circuit, as described above.

The peripheral circuit structure PS may further include lower interconnection lines INL, which are provided on the peripheral transistors PTR, and a first interlayer insulating layer ILD1, which is provided to cover the peripheral transistors PTR and the lower interconnection lines INL. A peripheral contact PCNT may be provided between the lower interconnection line INL and the peripheral transistor PTR to electrically connect the lower interconnection line INL to the peripheral transistor PTR. The first interlayer insulating layer ILD1 may include a plurality of stacked insulating layers. For example, the first interlayer insulating layer ILD1 may include a silicon oxide layer, a silicon nitride layer, a silicon oxynitride layer, and/or a low-k dielectric layer that are stacked upon each other.

The cell array structure CS may be provided on the first interlayer insulating layer ILD1 of the peripheral circuit structure PS. Hereinafter, the cell array structure CS will be described in more. A second substrate SL may be provided on the first interlayer insulating layer ILD1. In an embodiment, the second substrate SL may be a plate-shaped structure, which constitutes a lower portion of the mat MT and has a rectangular shape in a plan view. The second substrate SL may support the electrode structure ST provided thereon.

The second substrate SL may include a lower semiconductor layer LSL, a source semiconductor layer SSL, and an upper semiconductor layer USL, which are sequentially stacked. Each of the lower semiconductor layer LSL, the source semiconductor layer SSL, and the upper semiconductor layer USL may be formed of or may otherwise include semiconductor material (e.g., silicon (Si), germanium (Ge), silicon germanium (SiGc), gallium arsenic (GaAs), indium gallium arsenic (InGaAs), aluminum gallium arsenic (AlGaAs), or mixtures thereof). Each of the lower semiconductor layer LSL, the source semiconductor layer SSL, and the upper semiconductor layer USL may have single crystalline, amorphous, and/or polycrystalline structures. In an embodiment, each of the lower semiconductor layer LSL, the source semiconductor layer SSL, and the upper semiconductor layer USL may include an n-type poly-silicon layer doped with impurities. The lower semiconductor layer LSL, the source semiconductor layer SSL, and the upper semiconductor layer USL may have different impurity concentrations from each other.

The source semiconductor layer SSL may be interposed between the lower semiconductor layer LSL and the upper semiconductor layer USL. The lower semiconductor layer LSL and the upper semiconductor layer USL may be electrically connected to each other by the source semiconductor layer SSL. As an example, the upper semiconductor layer USL and the source semiconductor layer SSL may be overlapped with the lower semiconductor layer LSL, in a plan view.

The second substrate SL may include a cell array region CAR, a cell edge region EDR, and a connection region CNR. The cell array region CAR may overlap with a center of the second substrate SL. The connection region CNR may be provided at a side region of the second substrate SL. The connection region CNR may be extended from the side region of the cell array region CAR in the second direction D2. The cell edge region EDR may be provided outside or around the cell array region CAR. The cell edge region EDR may be interposed between the cell array region CAR and the connection region CNR.

The electrode structure ST may be provided on the second substrate SL. The electrode structure ST may include a first electrode structure ST1 and a second electrode structure ST2 disposed on the first electrode structure ST1. A second interlayer insulating layer ILD2 and a third interlayer insulating layer ILD3 may be provided on the second substrate SL. A top surface of the second interlayer insulating layer ILD2 may be coplanar with a top surface of the first electrode structure ST1. A top surface of the third interlayer insulating layer ILD3 may be coplanar with the top surface of the second electrode structure ST2. The second and third interlayer insulating layers ILD2 and ILD3 may at least partially cover the electrode structure ST on the connection region CNR.

The first electrode structure ST1 may include first electrodes EL1, which are stacked on the second substrate SL in a vertical direction (i.e., a third direction D3). The first electrode structure ST1 may further include first insulating layers IL1, which separate the first electrodes EL1 from each other. The first insulating layers IL1 and the first electrodes EL1 of the first electrode structure ST1 may be alternately stacked in the third direction D3. A second insulating layer IL2 may be provided at the topmost portion of the first electrode structure ST1. The second insulating layer IL2 may be thicker than each of the first insulating layers IL1.

The second electrode structure ST2 may include second electrodes EL2, which are stacked on the first electrode structure ST1 in the third direction D3. The second electrode structure ST2 may further include third insulating layers IL3, which separate the second electrodes EL2 from each other. The third insulating layers IL3 and the second electrodes EL2 of the second electrode structure ST2 may be alternately stacked in the third direction D3. A fourth insulating layer IL4 may be provided at the topmost portion of the second electrode structure ST2. The fourth insulating layer IL4 may be thicker than each of the third insulating layers IL3.

The electrode structure ST may be extended from the cell array region CAR to the connection region CNR. The electrode structure ST may have a staircase structure on the connection region CNR. The staircase structure of the electrode structure ST may have a height or thickness that decreases with increasing distance from the cell array region CAR. For example, the staircase structure of the electrode structure ST on the cell array region CAR may have a decreasing height or thickness in the second direction D2.

The lowermost one of the first electrodes EL1 of the electrode structure ST may be a lower selection line. The topmost one of the second electrodes EL2 of the electrode structure ST may be an upper selection line. Each of the first and second electrodes EL1 and EL2, other than the lower selection line and the upper selection line, may be word lines.

The first and second electrodes EL1 and EL2 may be formed of or may otherwise include at least one conductive material, for example, doped semiconductor materials (e.g., doped silicon), metals (e.g., tungsten, copper, or aluminum), conductive metal nitrides (e.g., titanium nitride or tantalum nitride) and/or transition metals (e.g., titanium or tantalum). The first to fourth insulating layers IL1-IL4 may be formed of or may otherwise include silicon oxide.

A plurality of first vertical channel structures VS1 may be provided on the cell array region CAR to at least partially penetrate the electrode structure ST. In an embodiment, as shown in FIG. 3, the first vertical channel structures VS1 may be arranged to form a first column C1, which is composed of four first vertical channel structures VS1 arranged in the first direction D1, and a second column C2, which is composed of five first vertical channel structures VS1 arranged in the first direction D1. In an embodiment, the first columns C1 and the second columns C2 may be repeatedly and/or alternately arranged in the second direction D2. A diameter of each of the first vertical channel structures VS1 may gradually decrease with decreasing distance from the first substrate SUB.

A plurality of second vertical channel structures VS2 may be provided on the cell edge region EDR to at least partially penetrate the electrode structure ST. The second vertical channel structures VS2 may have the same arrangement and pattern density as the first vertical channel structures VS1, except that the second vertical channel structures VS2 are disposed on the cell edge region EDR.

First and second dummy structures DS1 and DS2 may be provided on the connection region CNR to at least partially penetrate the electrode structure ST. In a plan view, a size of each of the first and second dummy structures DS1 and DS2 may be greater than a size of each of the first and second vertical channel structures VS1 and VS2. The first dummy structures DS1 may be adjacent to the cell edge region EDR. The second dummy structures DS2 may be provided on an outer region of the connection region CNR. The second dummy structures DS2 may at least partially penetrate the third interlayer insulating layer ILD3, the second interlayer insulating layer ILD2, and the staircase structure of the electrode structure ST below the second interlayer insulating layer ILD2.

Each of the first and second vertical channel structures VS1 and VS2 may include a vertical insulating pattern VP, a vertical semiconductor pattern SP, and a gapfill insulating pattern VI. The vertical semiconductor pattern SP may be interposed between the vertical insulating pattern VP and the gapfill insulating pattern VI. A conductive pad PAD may be provided on each of the first and second vertical channel structures VS1 and VS2.

The gapfill insulating pattern VI may have a circular pillar shape. The vertical semiconductor pattern SP may at least partially cover a surface of the gapfill insulating pattern VI and may be extended from the lower semiconductor layer LSL to the conductive pad PAD in the third direction D3. The vertical semiconductor pattern SP may be shaped like a pipe with an open top end. The vertical insulating pattern VP may at least partially cover an outer surface of the vertical semiconductor pattern SP and may be extended from the lower semiconductor layer LSL to the top surface of the second insulating layer IL2 in the third direction D3. The vertical insulating pattern VP may also be shaped like a pipe with an open top end. The vertical insulating pattern VP may be interposed between the electrode structure ST and the vertical semiconductor pattern SP.

The vertical insulating pattern VP may include one layer or a plurality of layers. In an embodiment, the vertical insulating pattern VP may include a data storing layer. For example, as shown in FIG. 5A, the vertical insulating pattern VP may include a tunnel insulating layer TNL, a charge storing layer CTL, and a blocking insulating layer BKL, which are used as the data storing layer of the NAND FLASH memory device.

For example, the charge storing layer CTL may be a trap insulating layer, a floating gate electrode, or an insulating layer including conductive nanodots. The charge storing layer CTL may be formed of or may otherwise include a silicon nitride layer, a silicon oxynitride layer, a silicon-rich nitride layer, a nanocrystalline silicon layer, and/or a laminated trap layer. The tunnel insulating layer TNL may be formed of or may otherwise include a material whose band gap is larger than the charge storing layer CTL. The tunnel insulating layer TNL may be formed of or may otherwise include high-k dielectric materials (e.g., aluminum oxide and hafnium oxide) or silicon oxide. As used herein, a high-k dielectric material is a material having a dielectric constant that is greater than silicon dioxide. The blocking insulating layer BKL may include a silicon oxide layer.

The vertical semiconductor pattern SP may be formed of or may otherwise include semiconductor materials (e.g., silicon (Si), germanium (Ge), or mixtures thereof). In addition, the vertical semiconductor pattern SP may be formed of or may otherwise include a doped or intrinsic semiconductor material. The vertical semiconductor pattern SP including the semiconductor material may be used as channel regions of transistors constituting cell strings of the NAND FLASH memory device.

The conductive pad PAD may at least partially cover a top surface of the vertical semiconductor pattern SP and a top surface of the gapfill insulating pattern VI. The conductive pad PAD may be formed of or may otherwise include doped semiconductor materials and/or conductive materials. A bit line contact plug BPLG may be electrically connected to the vertical semiconductor pattern SP through the conductive pad PAD.

The source semiconductor layer SSL may be in direct contact with a lower sidewall of each of the vertical semiconductor patterns SP. The source semiconductor layer SSL may electrically connect the vertical semiconductor patterns SP to each other. For example, the vertical semiconductor patterns SP may also be electrically connected to the second substrate SL. The second substrate SL may serve as the source electrodes of the memory cells. A common source voltage may be applied to the second substrate SL.

Each of the first and second dummy structures DS1 and DS2 may include the vertical insulating pattern VP, the vertical semiconductor pattern SP, and the gapfill insulating pattern VI, similar to the first and second vertical channel structures VS1 and VS2. However, the first and second dummy structures DS1 and DS2 might not serve as the channel region of the memory cell, unlike the first and second vertical channel structures VS1 and VS2. The first and second dummy structures DS1 and DS2 might not be electrically connected to bit lines BL and upper interconnection lines UIL, which will be described below. For example, the first and second dummy structures DS1 and DS2 may be dummy structures, which do not have any operational function upon a circuit (e.g. no not affect any voltage or current characteristics of a circuit) but may be formed in a similar manner and/or along with actual circuit elements. The first and second dummy structures DS1 and DS2 may physically support the staircase structure of the electrode structure ST.

Referring to FIGS. 4A and 5A, each of the first vertical channel structures VS1 may include a first vertical extended portion VEP1 at least partially penetrating the first electrode structure ST1, a second vertical extended portion VEP2 at least partially penetrating the second electrode structure ST2, and a first expanded portion EXP1 between the first and second vertical extended portions VEP1 and VEP2. The first expanded portion EXP1 may be provided in the second insulating layer IL2.

A width of the first vertical extended portion VEP1 in the second direction D2 may increase in an upward direction from bottom to top. For example, a width of an upper portion of the first vertical extended portion VEP1 in the second direction D2 may be a first width W1. The first width W1 of the first vertical extended portion VEP1 may be a value that is measured at the topmost level or at the level of the first electrode EL1. The first width W1 may be the largest width of the first vertical extended portion VEP1. A width of the second vertical extended portion VEP2 in the second direction D2 may increase in the upward direction from bottom to top. The largest width of the second vertical extended portion VEP2 may be at least similar to the first width W1.

A width of an upper portion of the first expanded portion EXP1 in the second direction D2 may be a third width W3. The third width W3 may be the largest width of the first expanded portion EXP1. The third width W3 may be greater than the first width W1. As an example, the first expanded portion EXP1 may be horizontally expanded from the first vertical extended portion VEP1 by a first recess distance RCD1. Accordingly, the third width W3 may be equal to a sum of the first width W and two times the first recess distance RCD1 (i.e., W3=W1+2×RCD1).

A bottom of the first expanded portion EXP1 may be located at a first level LV1. The first level LV1 may be the same level as a top surface of the first electrode EL1. The first level LV1 may be the same level as a bottom surface of the second insulating layer IL2.

A vertical length or height of the first expanded portion EXP1 may be a first length L1. The vertical length may be a length from the bottom of the first expanded portion EXP1 to the top surface of the first expanded portion EXP1.

Referring to FIG. 4A, each of the second vertical channel structures VS2 may include the first vertical extended portion VEP1, the second vertical extended portion VEP2, and a second expanded portion EXP2 between the first and second vertical extended portions VEP1 and VEP2. The second expanded portion EXP2 may be provided in the second insulating layer IL2. Bottom of the second expanded portion EXP2 may be located at a second level LV2. The second level LV2 may be higher than the first level LV1. The second level LV2 may be positioned between the bottom and top surfaces of the second insulating layer IL2. A vertical length of the second expanded portion EXP2 may be a second length L2 that is smaller than the first length L1. Except for the afore-described difference, the second vertical channel structure VS2 may be configured to have substantially the same features as those of the first vertical channel structure VS1.

Referring to FIG. 4A, each of the first dummy structures DS1 may include the first vertical extended portion VEP1, the second vertical extended portion VEP2, and a third expanded portion EXP3 between the first and second vertical extended portions VEP1 and VEP2. The third expanded portion EXP3 may be provided in the second insulating layer 112. The bottom of the third expanded portion EXP3 may be located at a third level LV3. The third level LV3 may be higher than the second level LV2. The third level LV3 may be positioned between the bottom and top surfaces of the second insulating layer IL2. A vertical length of the third expanded portion EXP3 may be a third length L3 that is smaller than the second length L2.

A width of an upper portion of the first vertical extended portion VEP1 of the first dummy structure DS in the second direction D2 may be a second width W2. The second width W2 may be the largest width of the first vertical extended portion VEP1 of the first dummy structure DS1. The second width W2 may be greater than the first width W1. A width of an upper portion of the third expanded portion EXP3 in the second direction D2 may be a fourth width W4. The fourth width W4 may be the largest width of the third expanded portion EXP3. The fourth width W4 may be greater than the second width W2.

Referring to FIGS. 4A and 4A, each of the second dummy structures DS2 may include the first vertical extended portion VEP1, the second vertical extended portion VEP2, and a fourth expanded portion EXP4 between the first and second vertical extended portions VEP1 and VEP2. The fourth expanded portion EXP4 may be provided in the second interlayer insulating layer ILD2. A bottom of the fourth expanded portion EXP4 may be located at a fourth level LV4. The fourth level LV4 may be higher than the third level LV3. The fourth level LV4 may be lower than the top surface of the second interlayer insulating layer ILD2. A vertical length of the fourth expanded portion EXP4 may be a fourth length L4 that is smaller than the third length L3.

A width of an upper portion of the first vertical extended portion VEP1 of the second dummy structure DS2 in the second direction D2 may be the second width W2. A width of an upper portion of the fourth expanded portion EXP4 in the second direction D2 may be the fourth width W4. As an example, the fourth expanded portion EXP4 may be horizontally expanded from the first vertical extended portion VEP1 by a second recess distance RCD2. Accordingly, the fourth width W4 may be equal to a sum of the second width W2 and two times the second recess distance RCD2 (i.e., W4=W2+2×RCD2). In an embodiment, the second recess distance RCD2 may be substantially equal to the first recess distance RCD1 of FIG. 4A.

Referring to FIG. 4A, the top surfaces of the first to fourth expanded portions EXP1-EXP4 may be coplanar with each other. The top surfaces of the first to fourth expanded portions EXP1-EXP4 may be coplanar with the top surface of the second insulating layer IL2. The bottoms of the first to fourth expanded portions EXP1-EXP4 may be located at different levels. The levels of the bottoms of the first to fourth expanded portions EXP1-EXP4 may be elevated in a direction from the first expanded portion EXP1 to the fourth expanded portion EXP4. The vertical lengths of the first to fourth expanded portions EXP1-EXP4 may be decreased in the direction from the first expanded portion EXP1 toward the fourth expanded portion EXP4.

Referring to FIGS. 5A and 5B, a ratio W3/W1 of the third width W3 to the first width W1 in the first vertical channel structure VS1 may be greater than a ratio W4/W2 of the fourth width W4 to the second width W2 in the second dummy structure DS2. For example, for the first vertical channel structure VS1, since the first width W1 is relatively small, a difference between the third width W3 and the first width W1 (i.e., 2×RCD1) may be relatively large, compared with the first width W1. For the second dummy structure DS2, since the second width W2 is relatively large, a difference between the fourth width W4 and the second width W2 (i.e., 2×RCD2) may be relatively small, compared with the second width W2.

Referring back to FIGS. 3, 4A, and 4B, a plurality of separation structures SPS may at least partially penetrate the electrode structure ST. The separation structures SPS may be extended in a second direction D2, parallel to each other. The electrode structure ST may be divided into a plurality of structures, which are horizontally spaced apart from each other by the separation structures SPS. For example, each electrode EL1 or EL2 of the electrode structure ST may be divided into a plurality of electrodes, which are horizontal spaced apart from each other by the separation structures SPS. The separation structures SPS may be formed of or may otherwise include an insulating material (e.g., silicon oxide).

The three-dimensional semiconductor memory device according to an embodiment of the inventive concept may be a three-dimensional NAND FLASH memory device. NAND cell strings may be integrated in the electrode structure ST on the second substrate SL. For example, the electrode structure ST and the first and second vertical channel structures VS1 and VS2 at least partially penetrating the same may constitute memory cells, which are three-dimensionally arranged on the second substrate SL. The first and second electrodes EL1 and EL2 of the electrode structure ST may be used as the gate electrodes of the transistors.

A fourth interlayer insulating layer ILD4 may be provided on the third interlayer insulating layer ILD3. The bit line contact plugs BPLG may at least partially penetrate the fourth interlayer insulating layer ILD4 and may be respectively coupled to the conductive pads PAD. The bit lines BL may be disposed on the fourth interlayer insulating layer ILD4. The bit lines BL may be extended in the first direction D1, parallel to each other. The bit lines BL may be electrically connected to the first and second vertical channel structures VS1 and VS2, respectively, through the bit line contact plugs BPLG.

The cell contact plugs PLG may at least partially penetrate the second to fourth interlayer insulating layers ILD2, ILD3, and ILD4 and may be respectively coupled to the first and second electrodes EL1 and EL2 constituting the staircase structure. The upper interconnection lines UIL may be disposed on the fourth interlayer insulating layer ILD4. The upper interconnection lines UIL may be electrically connected to the first and second electrodes EL1 and EL2, respectively, through the cell contact plugs PLG.

According to an embodiment of the inventive concept, a vertical channel structure on a cell region may include an expanded portion disposed between a first vertical extended portion and a second vertical extended portion. The first vertical extended portion and the second vertical extended portion may be stably connected to each other through the expanded portion. Accordingly, it may be possible to increase the reliability and support the electric characteristics of the semiconductor memory device according to an embodiment of the inventive concept.

FIGS. 6A, 7A, 8A, 9A, 10A, 11A, 12A, 13A, 14A, and 15A are cross-sectional views, which are taken along the line I-I' of FIG. 3 to illustrate a method of fabricating a three-dimensional semiconductor memory device, according to an embodiment of the inventive concept. FIGS. 6B, 7B, 8B, 9B, 10B, 11B, 12B, 13B, 14B, and 15B are cross-sectional views, which are taken along the line II-II' of FIG. 3 to illustrate a method of fabricating a three-dimensional semiconductor memory device, according to an embodiment of the inventive concept.

Figure 6A:
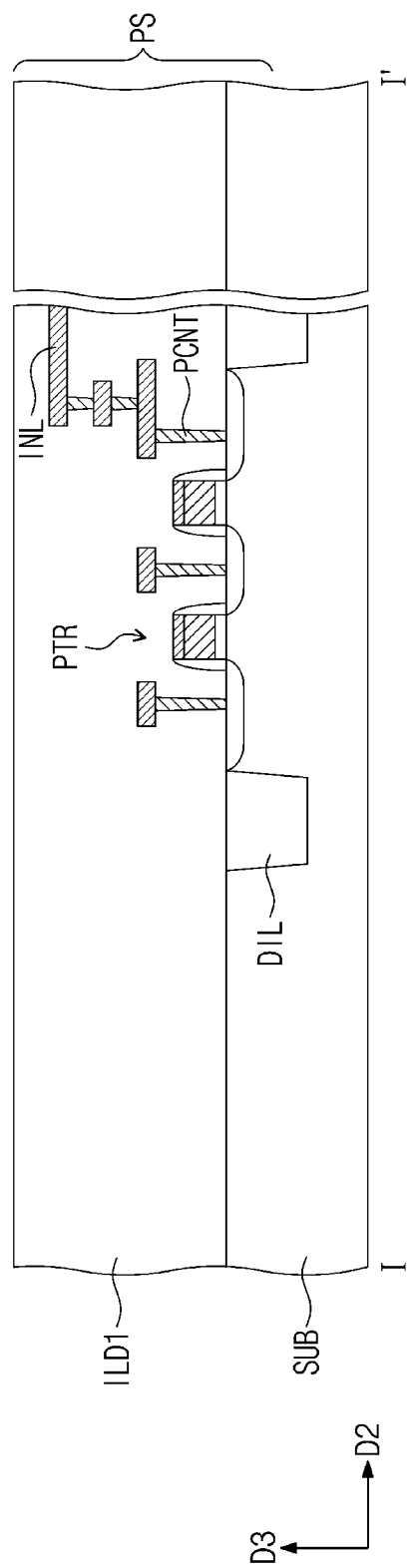
FIGS. 6A, 7A, 8A, 9A, 10A, 11A, 12A, 13A, 14A, and 15A are cross-sectional views, which are taken along the line I-I' of FIG. 3 to illustrate a method of fabricating a three-dimensional semiconductor memory device, according to an embodiment of the inventive concept.
Figure 6B:
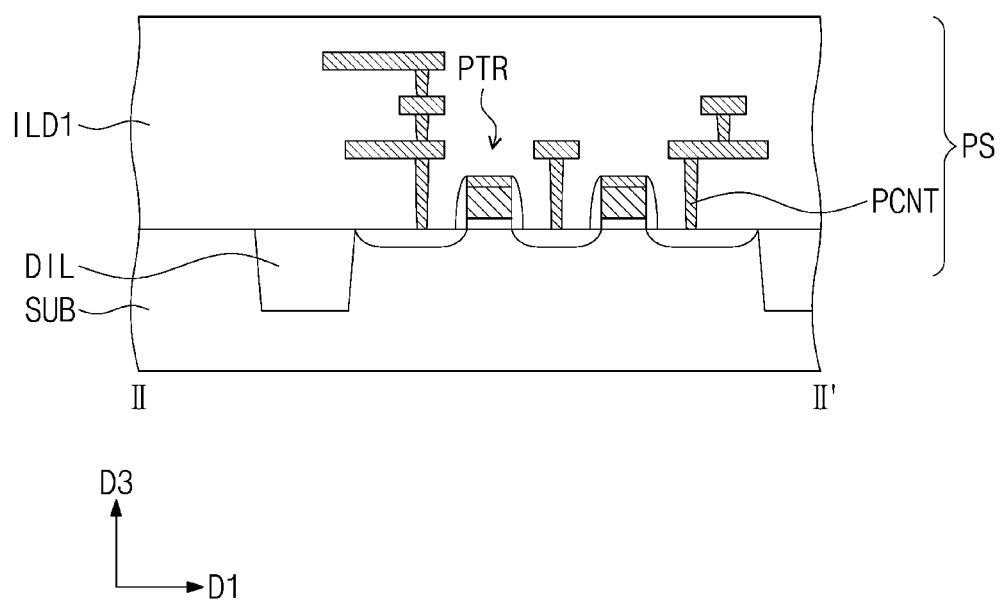
FIGS. 6B, 7B, 8B, 9I, 10B, 11B, 12B, 13B, 14B, and 15B are cross-sectional views, which are taken along the line II-II' of FIG. 3 to illustrate a method of fabricating a three-dimensional semiconductor memory device, according to an embodiment of the inventive concept.

Referring to FIGS. 3, 6A, and 6B, the peripheral circuit structure PS may be formed on the first substrate SUB. The formation of the peripheral circuit structure PS may include forming the peripheral transistors PTR on the first substrate SUB and forming the lower interconnection lines INL on the peripheral transistors PTR. For example, the formation of the peripheral transistors PTR may include forming the device isolation layer DIL on the first substrate SUB to define active regions, forming a gate insulating layer and a gate electrode on the active regions, and injecting impurities into the active regions to form source/drain regions. The first interlayer insulating layer ILD1 may cover the peripheral transistors PTR and the lower interconnection lines INL.

Figure 7A:
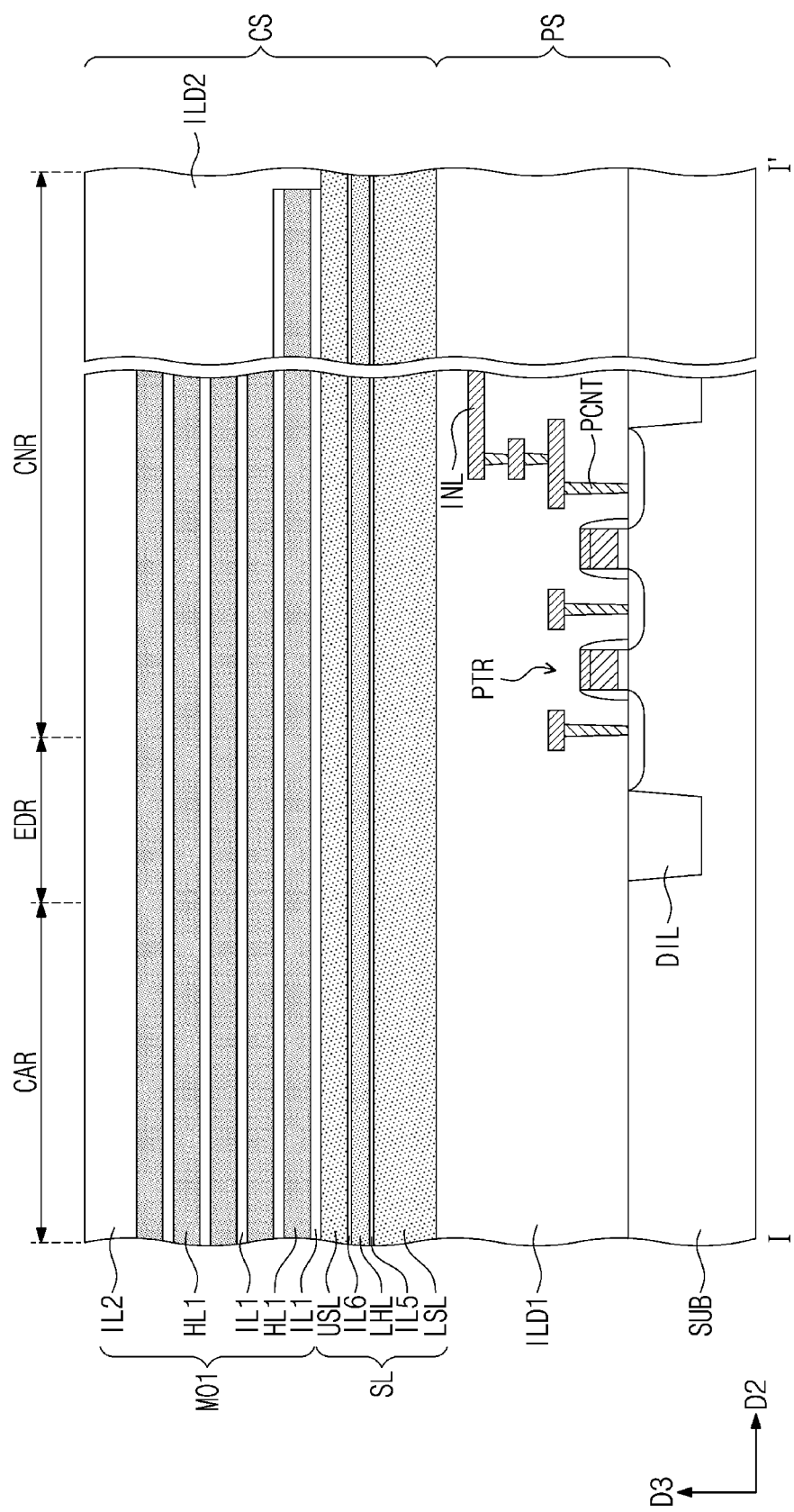
Figure 7B:
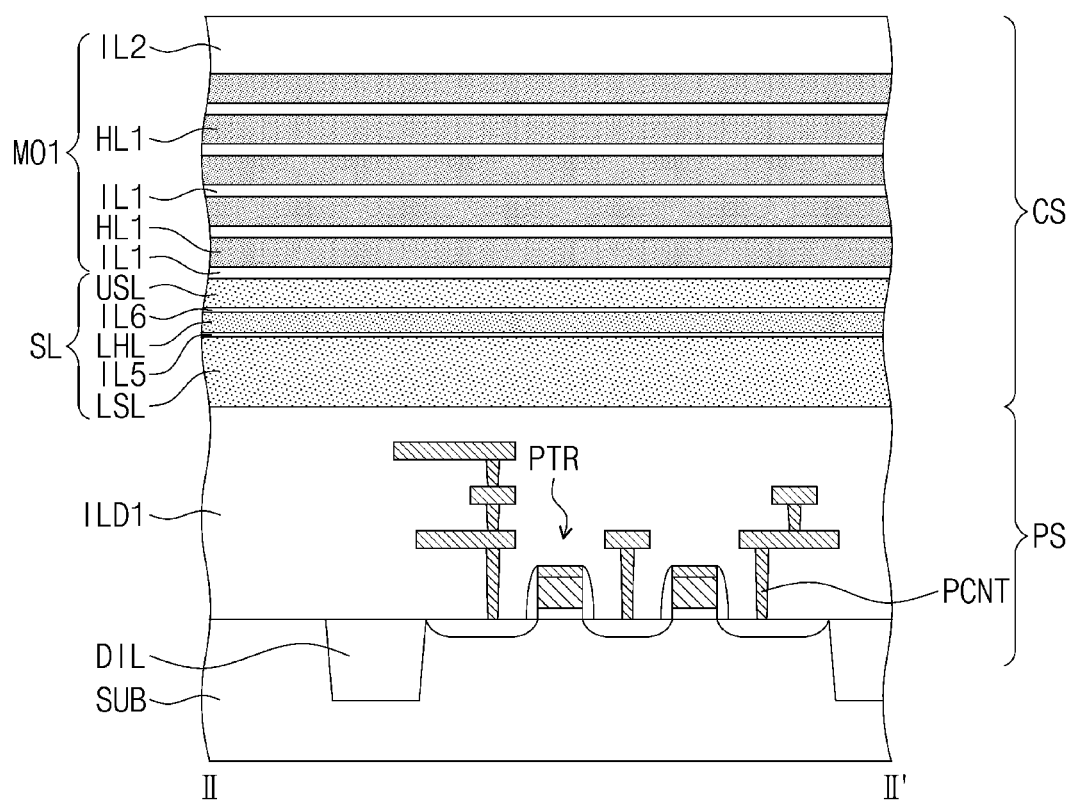

Referring to FIGS. 3, 7A, and 7B, the second substrate SL may be formed on the first interlayer insulating layer ILD1. The formation of the second substrate SL may include sequentially forming the lower semiconductor layer LSL, a fifth insulating layer IL5, a lower sacrificial layer LHL, a sixth insulating layer IL6, and the upper semiconductor layer USL. For example, the lower semiconductor layer LSL and the upper semiconductor layer USL may be formed of or may otherwise include a semiconductor material (e.g., polysilicon). The fifth and sixth insulating layers IL5 and IL6 may include a silicon oxide layer, and the lower sacrificial layer LHL may include a silicon nitride layer or a silicon oxynitride layer.

A first mold structure MO1 may be formed on the second substrate SL. For example, the first insulating layers IL1 and first sacrificial layers HL1 may be alternately stacked on the upper semiconductor layer USL to form the first mold structure MO1. The second insulating layer IL2 may be formed as the topmost layer of the first mold structure MO1.

The first insulating layers IL1, the first sacrificial layers HL1, and the second insulating layer IL2 may be deposited using a thermal chemical vapor deposition process, a plasma-enhanced chemical vapor deposition (PE-CVD) process, a physical chemical vapor deposition process, and/or an atomic layer deposition (ALD) process. The first insulating layers IL1 and the second insulating layer IL2 may be formed of or may otherwise include silicon oxide, and the first sacrificial layers HL1 may be formed of or may otherwise include silicon nitride or silicon oxynitride.

A staircase structure may be formed in the first mold structure MO1 on the connection region CNR. For example, the staircase structure on the connection region CNR may be formed by performing a cyclic process on the first mold structure MO1. The formation of the staircase structure may include forming a mask pattern on the first mold structure MO1 and performing a cyclic process using the mask pattern several times. Each cyclic process may include a process of etching a portion of the first mold structure MO1 using the mask pattern as an etch mask and a trimming process of shrinking the mask pattern.

The second interlayer insulating layer ILD2 may be formed on the first mold structure MO1. The formation of the second interlayer insulating layer ILD2 may include forming an insulating layer to cover the first mold structure MO1 and performing a planarization process on the insulating layer to expose the second insulating layer IL2.

Figure 8A:
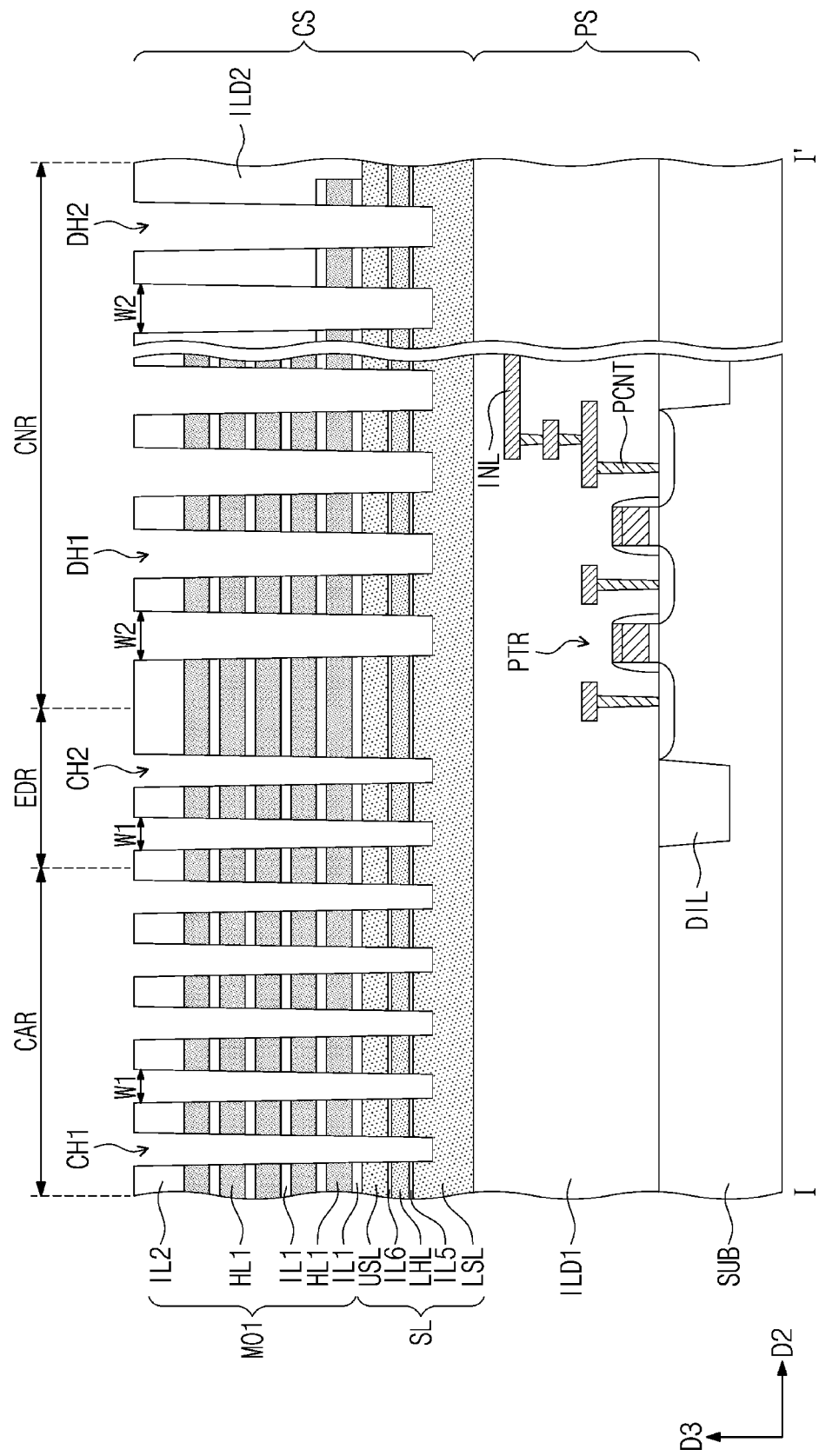
Figure 8B:
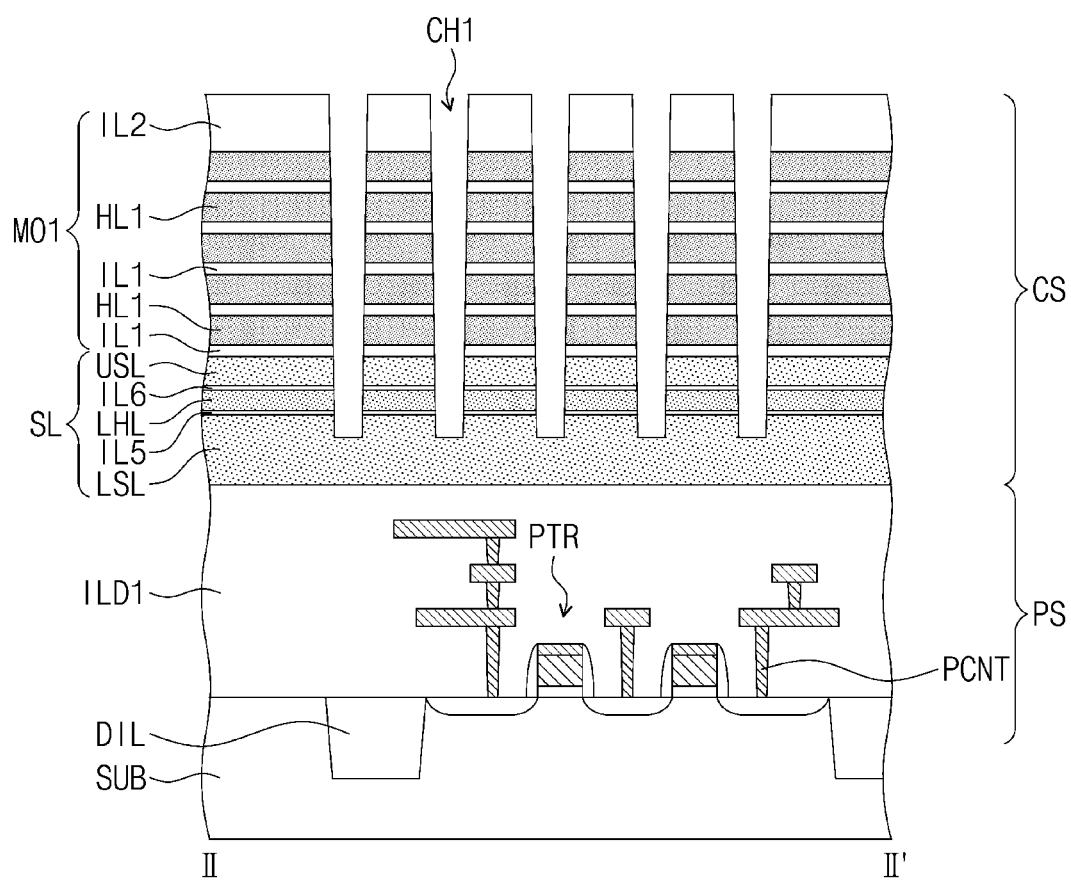

Referring to FIGS. 3, 8A, and 8B, first channel holes CH1 may be formed on the cell array region CAR to at least partially penetrate the first mold structure MO1. Second channel holes CH2 may be formed on the cell edge region EDR to at least partially penetrate the first mold structure MO1. First and second dummy holes DH1 and DH2 may be formed on the connection region CNR to at least partially penetrate the first mold structure MO1. The second dummy holes DH2 may be provided to at least partially penetrate the second interlayer insulating layer ILD2. Each of the first and second channel holes CH1 and CH2 and the first and second dummy holes DH1 and DH2 may expose the lower semiconductor layer LSL.

For example, the formation of the first and second channel holes CH1 and CH2 and the first and second dummy holes DH1 and DH2 may include a mask pattern, which has openings defining the arrangement and positions of holes, on the first mold structure MO1, and anisotropically etching the first mold structure MO1 using the mask pattern as an etch mask. The anisotropic etching process may include a plasma etching process, a reactive ion etching (RIE) process, an inductively-coupled plasma reactive ion etching (ICP-RIE) process, and/or an ion beam etching (IBE) process.

In a plan view, the first and second channel holes CH1 and CH2 may be arranged in a specific direction or in a zigzag shape. The first and second channel holes CH1 and CH2 may have the same planar arrangement as that of the first and second vertical channel structures VS1 and VS2 previously described with reference to FIG. 3.

A pattern density of the first and second channel holes CH1 and CH2 may be greater than that of the first and second dummy holes DH1 and DH2. For example, the number of the first and second channel holes CH1 and C12 formed within a unit area may be greater than the number of the first and second dummy holes DH1 and DH2 formed within the unit area.

An upper portion of each of the first and second channel holes CH1 and CH2 may have the first width W1 in the second direction D2. For example, the largest diameter of each of the first and second channel holes CH1 and CH2 may be equal to the first width W1. An upper portion of each of the first and second dummy holes DH1 and DH2 may have the second width W2 in the second direction D2. For example, the largest diameter of each of the first and second dummy holes DH1 and DH2 may be equal to the second width W2. In an embodiment, the second width W2 may be greater than the first width W1.

Figure 9A:
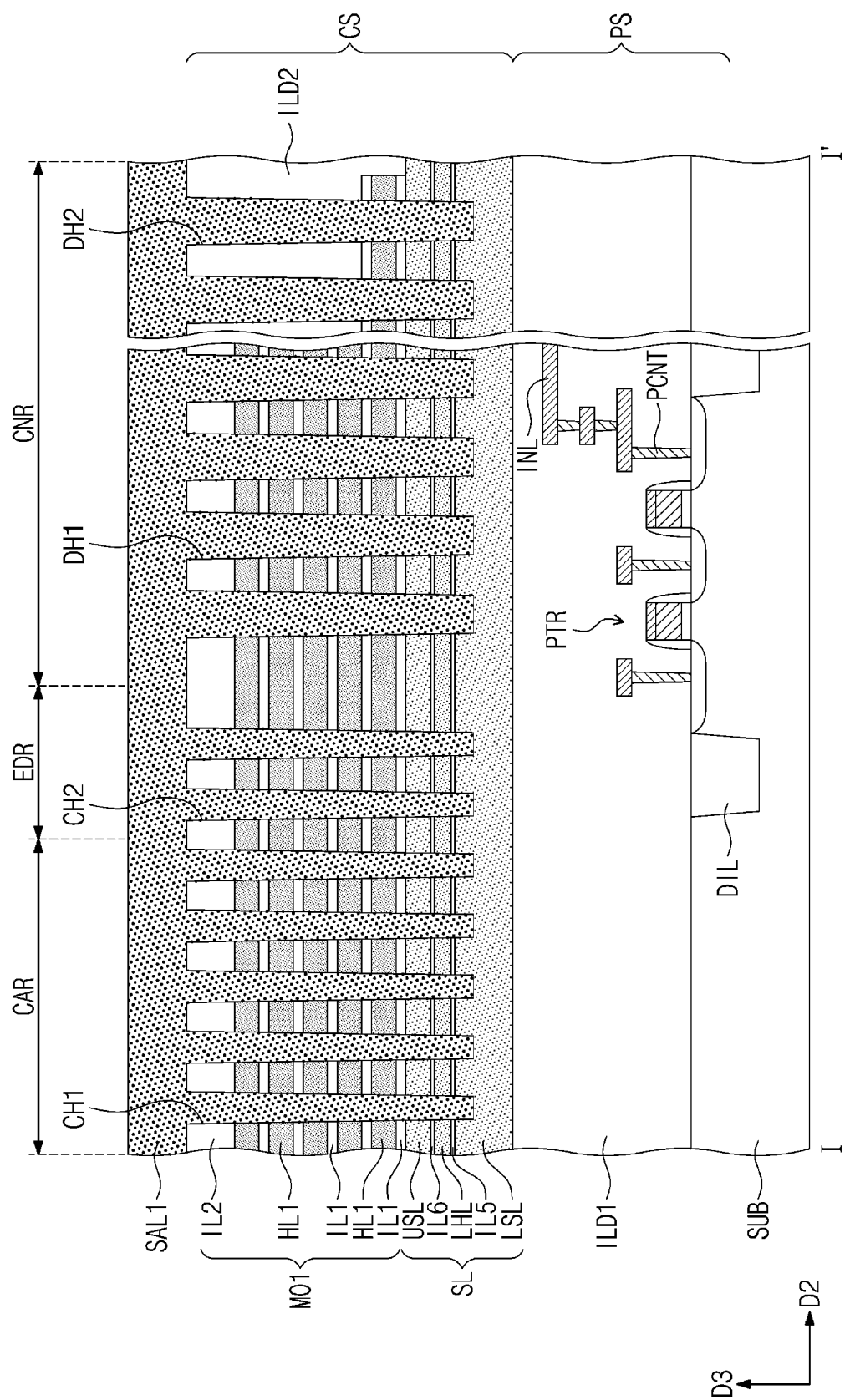
Figure 9B:
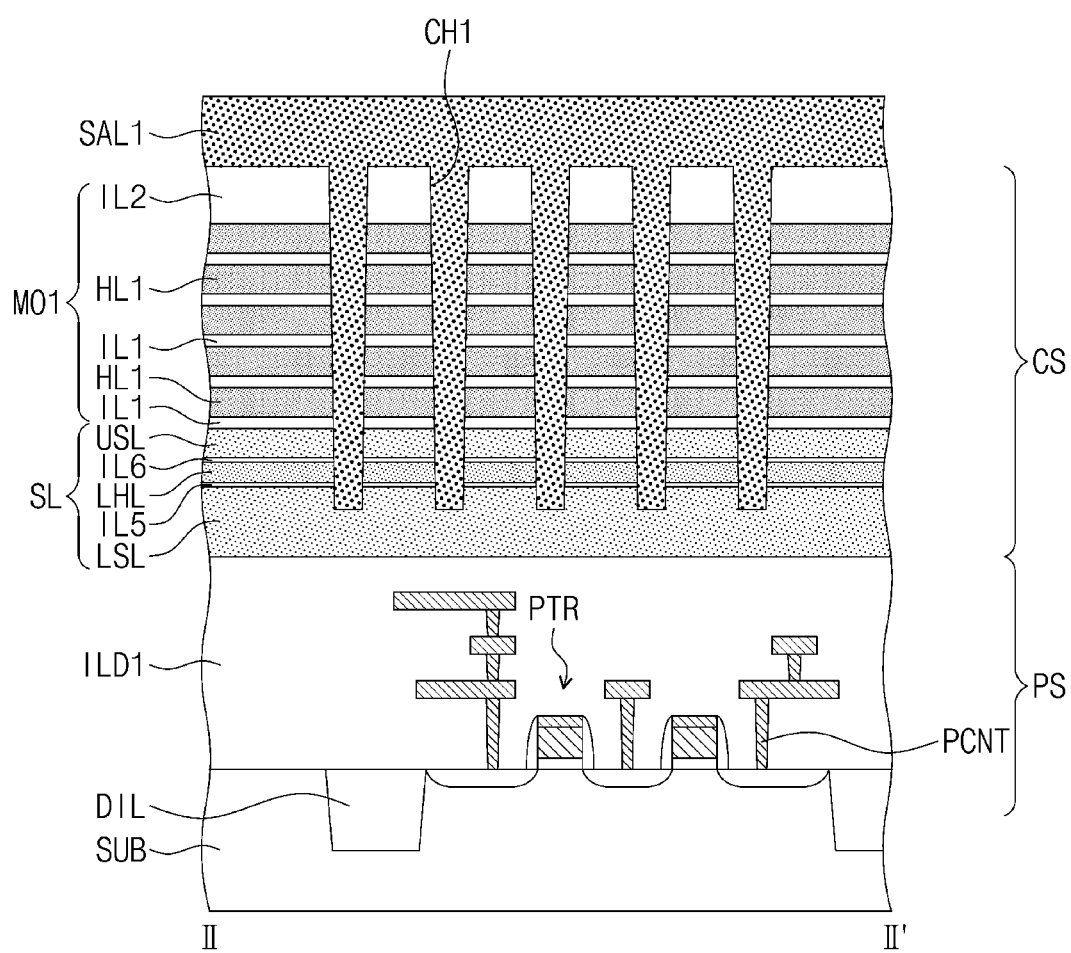

Referring to FIGS. 3, 9A, and 9B, a first sacrificial mask layer SAL1 may fill the first and second channel holes CH1 and CH2 and the first and second dummy holes DH and DH2.

The first sacrificial mask layer SAL1 may be formed by a spin coating process. The first sacrificial mask layer SAL1 may include a spin-on-hardmask (SOH). For example, the first sacrificial mask layer SAL1 may include a layer (e.g., an amorphous carbon layer) having a high carbon content (e.g. a content of carbon that is more than nominal). Immediately after forming the first sacrificial mask layer SAL1 on the first mold structure MO1, the first sacrificial mask layer SAL1 may have a uniform thickness on the first mold structure MO1. For example, the first sacrificial mask layer SAL1 may have a substantially coplanar top surface from the cell array region CAR to the connection region CNR.

Figure 10A:
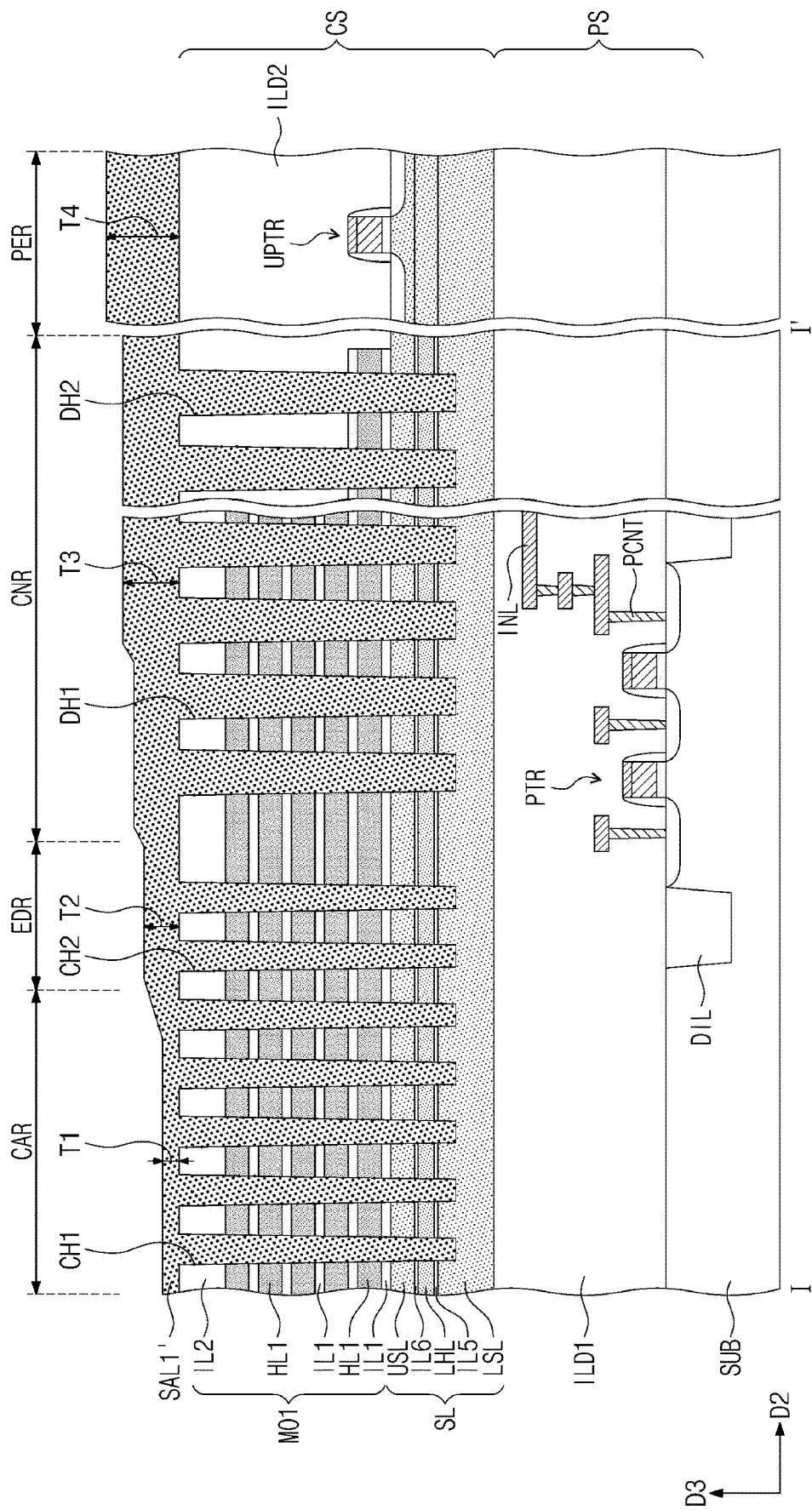
Figure 10B:
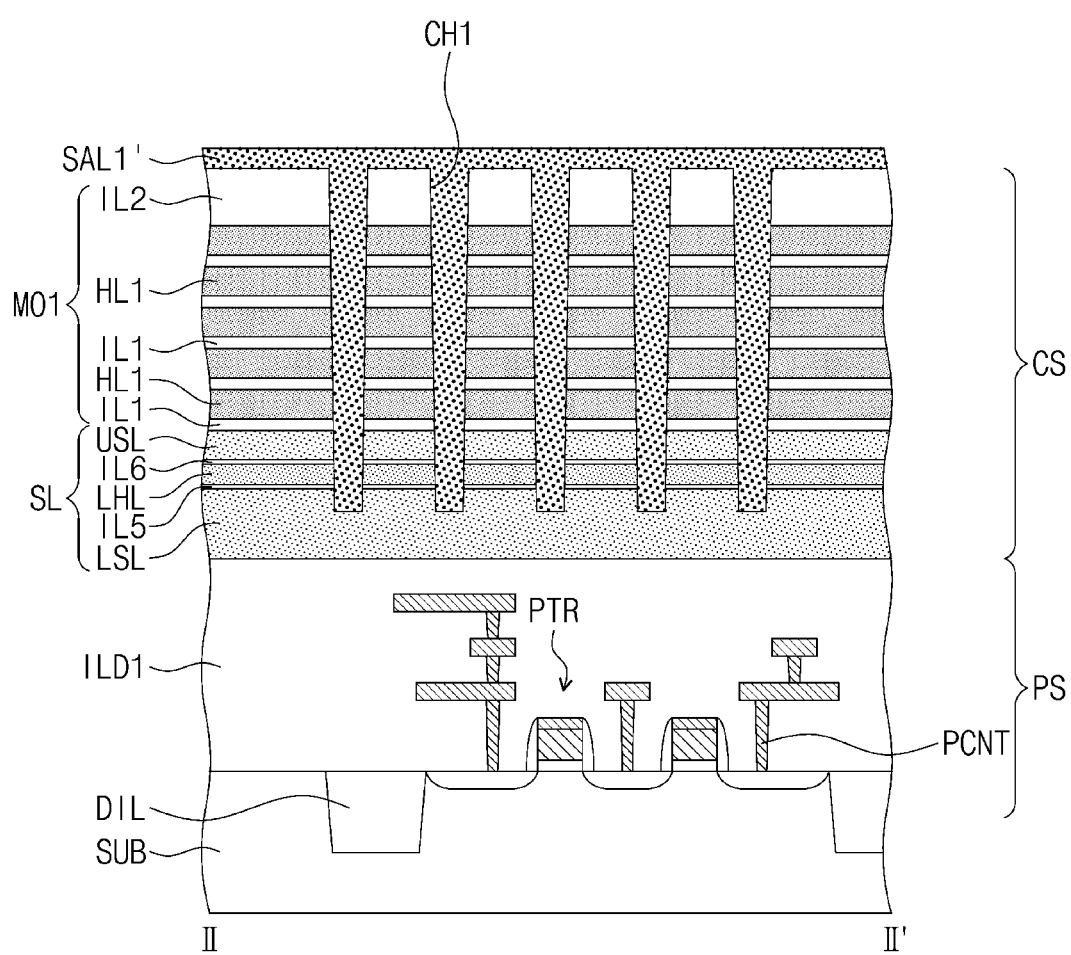

Referring to FIGS. 3, 10A, and 10B, a bake process may be performed on the first sacrificial mask layer SAL1. A first sacrificial mask layer SAL1' may be shrunken, as a result of the bake process.

The first sacrificial mask layer SAL1' may be more shrunken on the first channel holes CH1 having the high pattern density. The first sacrificial mask layer SAL1' may be less shrunken on the second dummy holes DH2 having the low pattern density. Thus, a thickness of the first sacrificial mask layer SAL1' on the first mold structure MO1 may gradually increase in a direction from the first channel hole CH1 of the cell array region CAR toward the second dummy hole DH2 of the connection region CNR. For example, a level of a top surface of the first sacrificial mask layer SAL1' may gradually increase in a direction from the cell array region CAR toward the connection region CNR.

For example, the first sacrificial mask layer SAL1' of the cell array region CAR may have a first thickness T1, the first sacrificial mask layer SAL1' of the cell edge region EDR may have a second thickness T2, and the first sacrificial mask layer SAL1' of the connection region CNR may have a third thickness T3. The second thickness T2 may be greater than the first thickness T1, and the third thickness T3 may be greater than the second thickness T2.

The second substrate SL may include a peripheral circuit region PER, which is an outer edge region thereof, and on which an upper peripheral transistor UPTR is formed. The first sacrificial mask layer SAL1' on the peripheral circuit region PER may have a fourth thickness T4. The fourth thickness T4 may be greater than the third thickness T3.

Figure 11A:
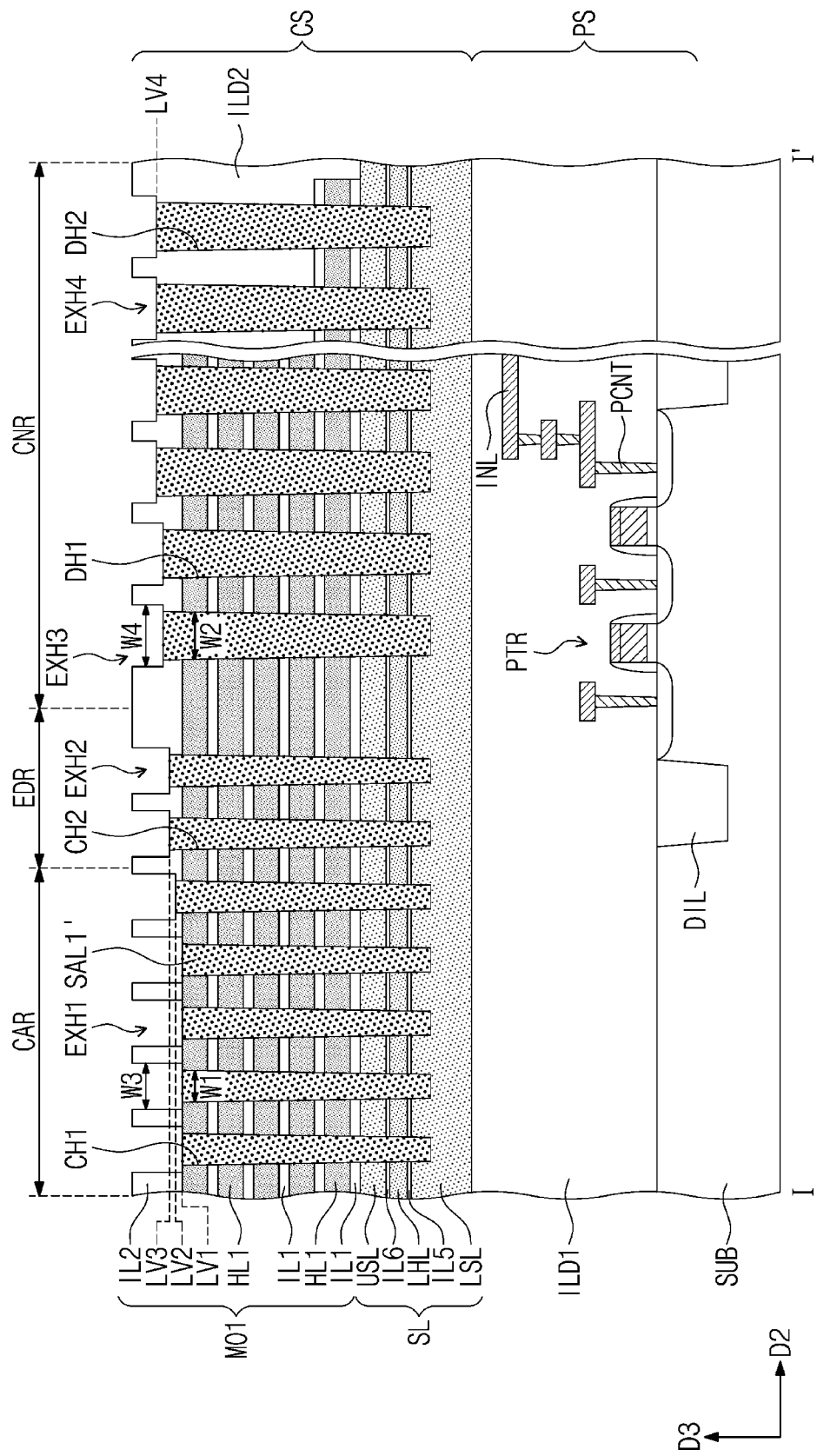
Figure 11B:
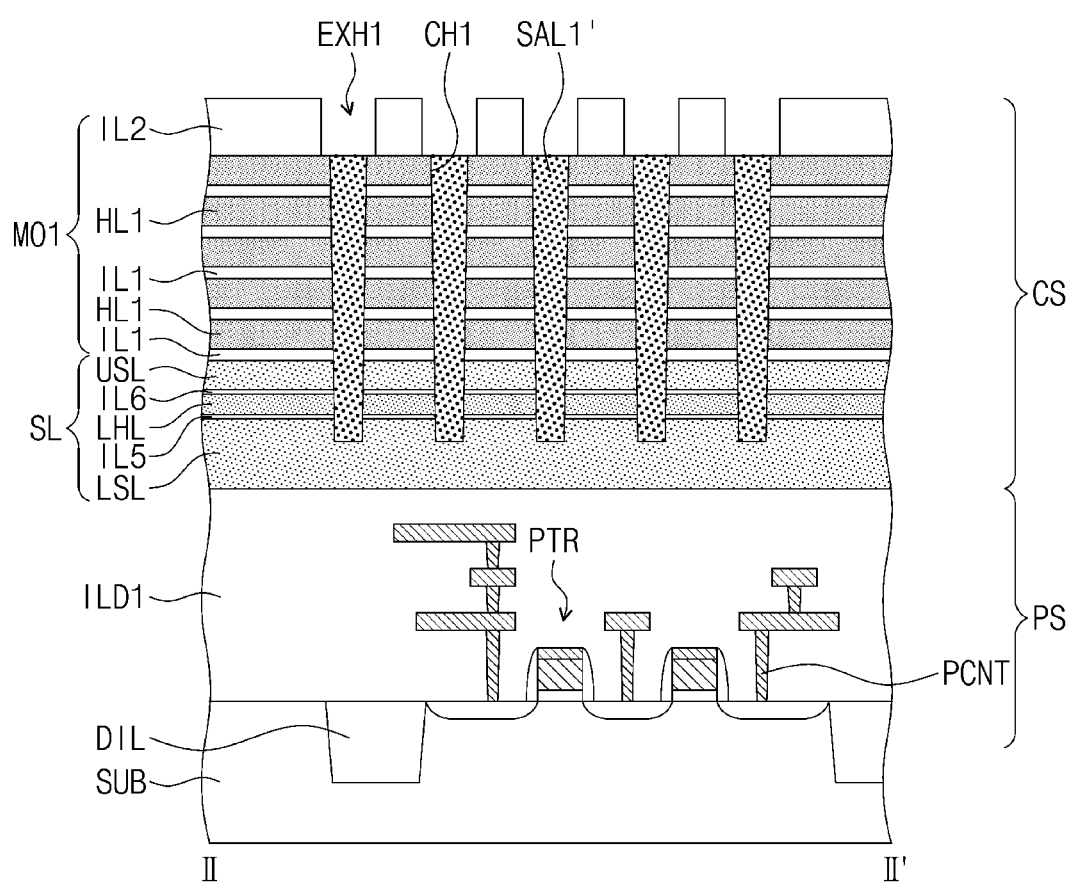

Referring to FIGS. 3, 11A, and 11B, the first sacrificial mask layer SAL1' may be recessed. As a result of the recessing of the first sacrificial mask layer SAL1', the first and second channel holes CH1 and CH2 and the first and second dummy holes DH1 and DH2 may be filled with the first sacrificial mask layer SAL1', which is recessed.

The first sacrificial mask layer SAL1' may be recessed by the same depth throughout the entire region of the second substrate SL. Since, as described above, the first sacrificial mask layer SAL1 has an increasing thickness in the direction from the cell array region CAR to the connection region CNR, the height of the recessed first sacrificial mask layer SAL1' may gradually increase in the direction from the cell array region CAR toward the connection region CNR.

For example, the top surface of the first sacrificial mask layer SAL1' in the first channel hole CH1 may be positioned at the first level LV1, the top surface of the first sacrificial mask layer SAL1' in the second channel hole CH2 may be positioned at the second level LV2, the top surface of the first sacrificial mask layer SAL1' in the first dummy hole DH1 may be positioned at the third level LV3, and the top surface of the first sacrificial mask layer SAL1' in the second dummy hole DH2 may be positioned at the fourth level LV4. The second level LV2 may be higher than the first level LV1, the third level LV3 may be higher than the second level LV2, and the fourth level LV4 may be higher than the third level LV3.

First to fourth expanded holes EXH1-EXH4 may be respectively formed by expanding the upper portions of the first and second channel holes CH1 and CH2 and the first and second dummy holes DH1 and DH2 using the recessed first sacrificial mask layer SAL1' as a mask. The formation of the first to fourth expanded holes EXH1-EXH4 may include horizontally recessing the second insulating layer IL2 and the second interlayer insulating layer ILD2, which are exposed through the recessed first sacrificial mask layer SAL1', using a wet etching process.

During the recess process, the second insulating layer IL2 may be recessed by the first recess distance RCD1 of FIG. 5A. During the recess process, the second interlayer insulating layer ILD2 may be recessed by the second recess distance RCD2 of FIG. 5B. In an embodiment, the second recess distance RCD2 may be substantially equal to the first recess distance RCD1 of FIG. 4A.

The bottoms of the first to fourth expanded holes EXH1-EXH4 may be located at the first to fourth levels LV1-LV4, respectively. Each of the first and second expanded holes EXH1 and EXH2 may have the third width W3. The third width W3 may be greater than the first width W1. Each of the third and fourth expanded holes EXH3 and EXH4 may have the fourth width W4. The fourth width W4 may be greater than the second width W2.

Figure 12A:
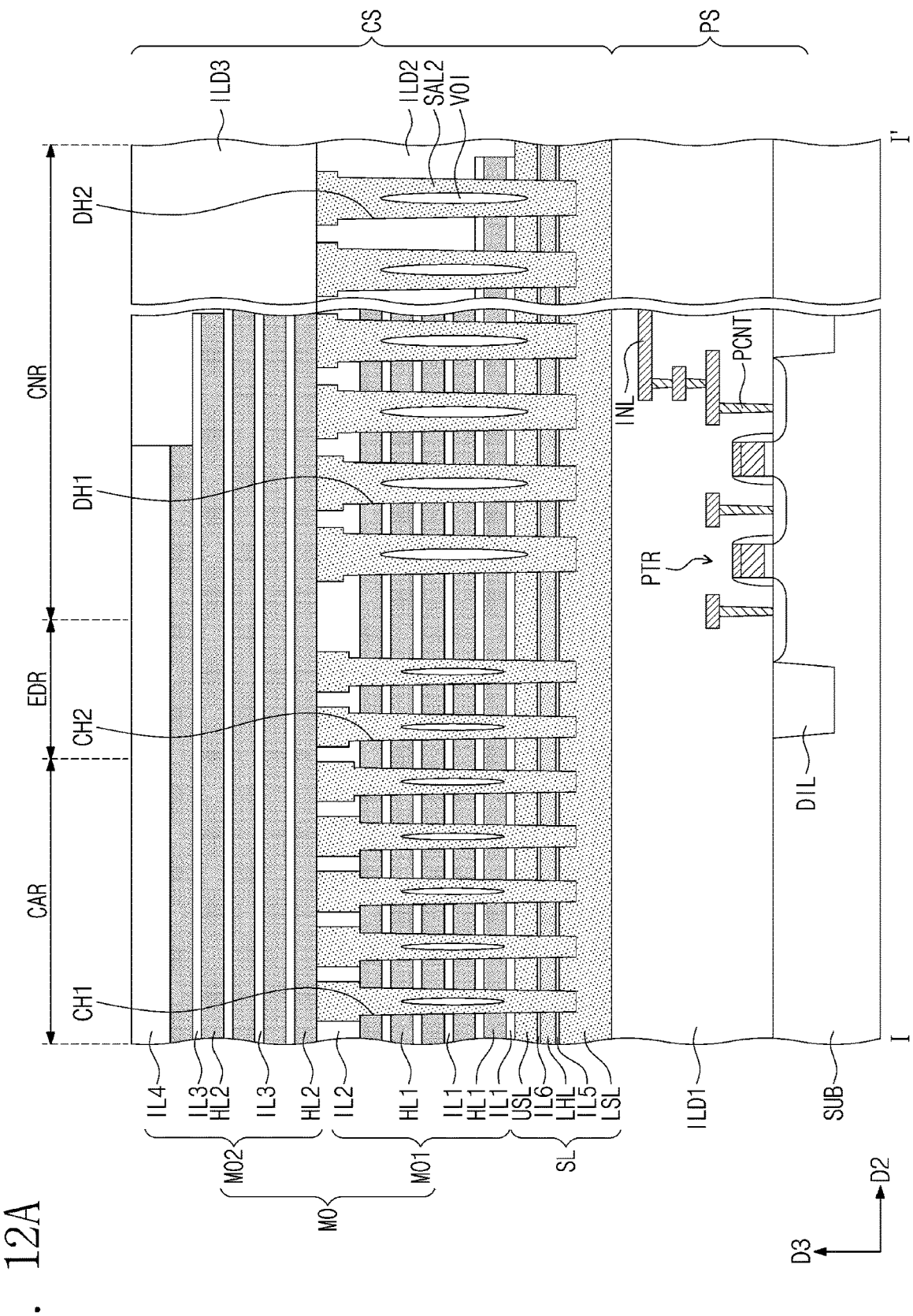
Figure 12B:
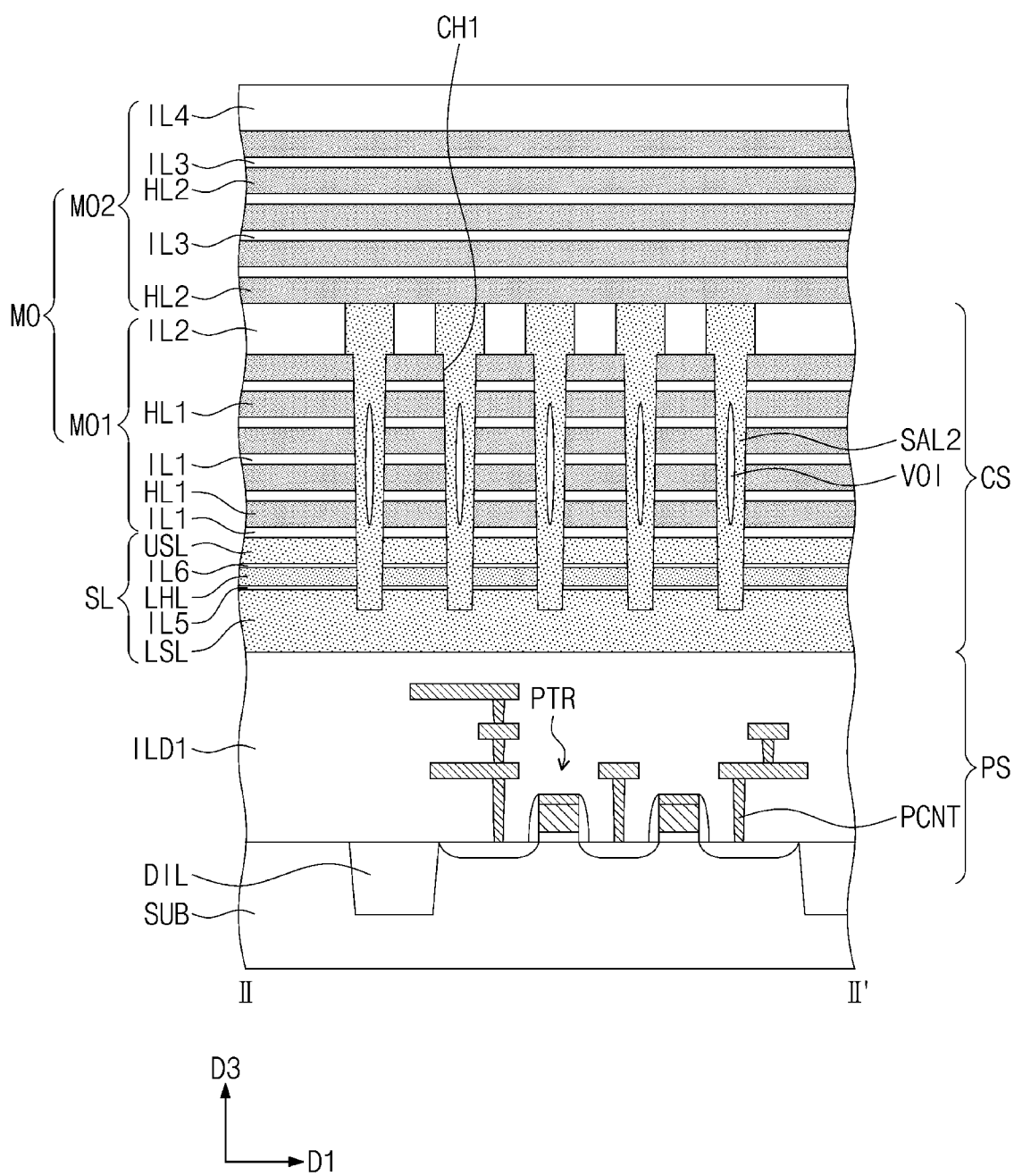

Referring to FIGS. 3, 12A, and 12B, the first sacrificial mask layer SAL1' in the first and second channel holes CH1 and CH2 and the first and second dummy holes DH1 and DH2 may be selectively removed. A second sacrificial mask layer SAL2 may be formed in the first and second channel holes CH1 and CH2 and the first and second dummy holes DH1 and DH2. For example, the second sacrificial mask layer SAL2 may be formed of or may otherwise include polysilicon. When the second sacrificial mask layer SAL2 is formed, a void VO1 may be formed in each of the first and second channel holes CH1 and CH2 and the first and second dummy holes DH1 and DH2.

A second mold structure MO2 may be formed on the first mold structure MO. For example, the second mold structure MO2 may be formed by alternately stacking the third insulating layers IL3 and second sacrificial layers HL2 on the first mold structure MOL. The fourth insulating layer IL4 may be formed at the topmost level of the second mold structure MO2. The first mold structure MO1 and the second mold structure MO2 may constitute a single mold structure MO. The third insulating layers IL3 and the fourth insulating layer IL4 may be formed of or may otherwise include silicon oxide, and the second sacrificial layers HL2 may be formed of or may otherwise include silicon nitride or silicon oxynitride.

A staircase structure may be formed in the second mold structure MO2 on the connection region CNR. The staircase structure of the second mold structure MO2 may be formed by the same method as that for the staircase structure of the first mold structure MO1.

The third interlayer insulating layer ILD3 may be formed on the second mold structure MO2. The formation of the third interlayer insulating layer ILD3 may include forming an insulating layer to cover the second mold structure MO2 and performing a planarization process on the insulating layer to expose the fourth insulating layer IL4.

Figure 13A:
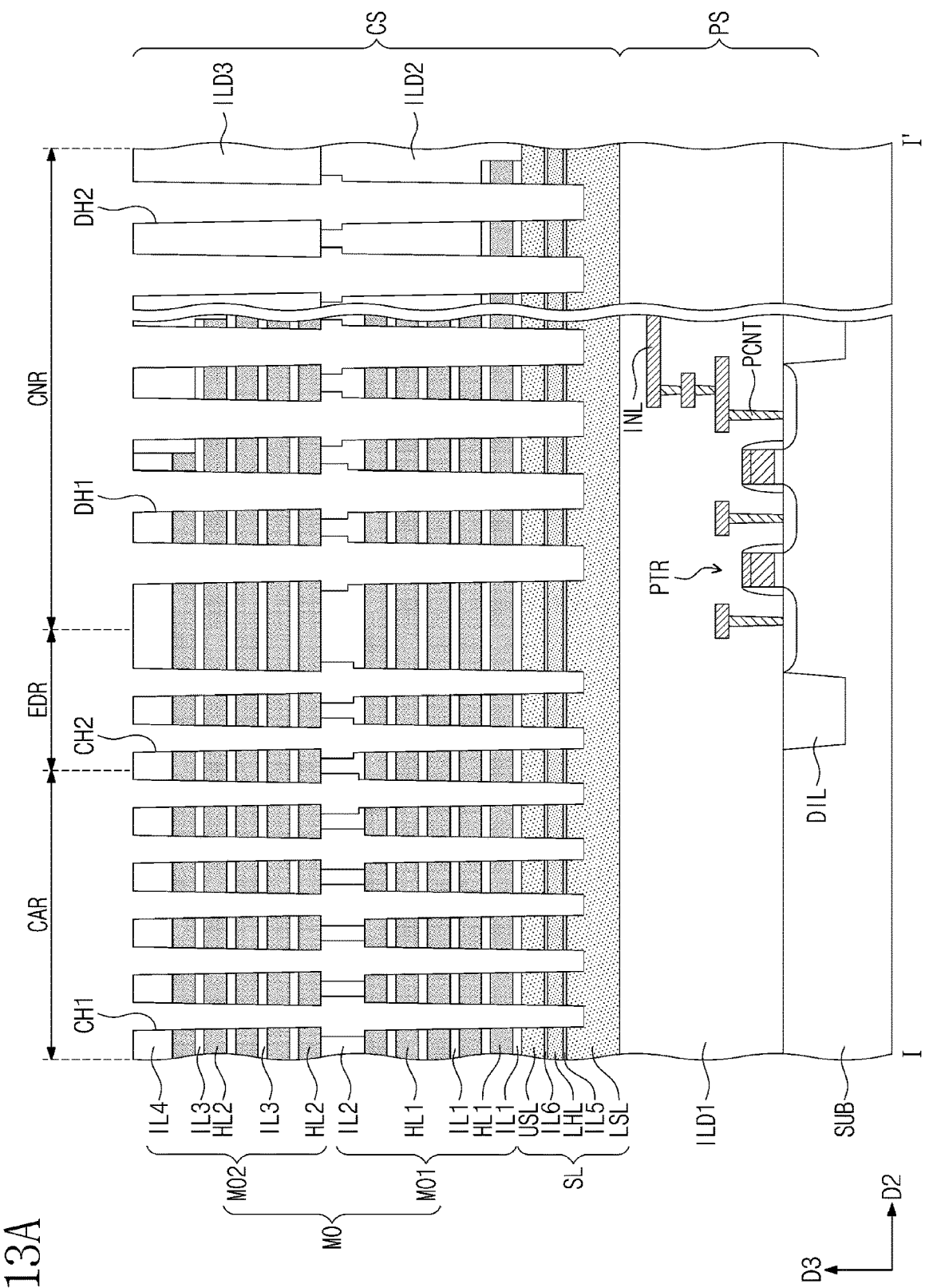
Figure 13B:
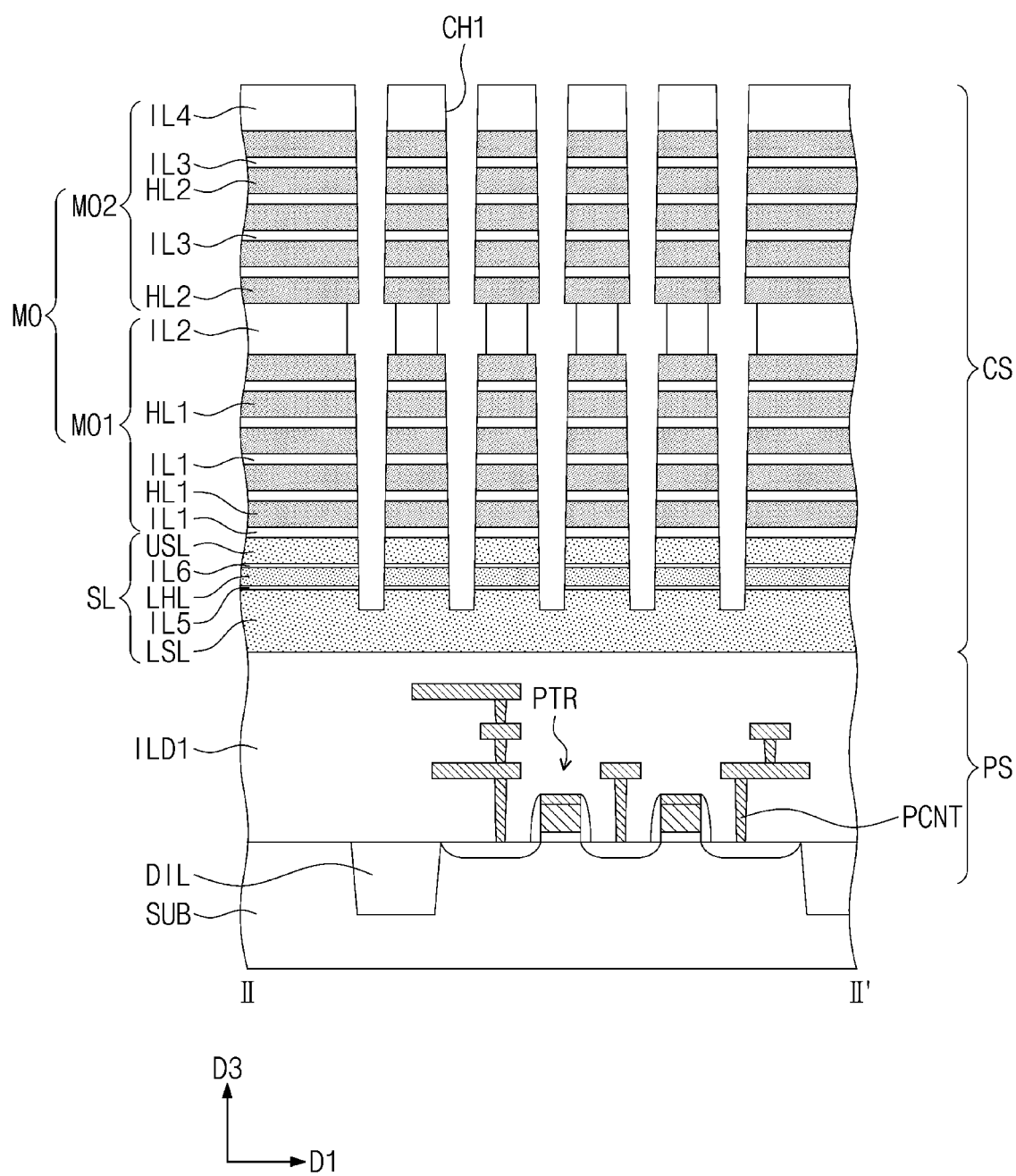

Referring to FIGS. 3, 13A, and 13B, the first and second channel holes CH1 and CH2 and the first and second dummy holes DH1 and DH2 may at least partially penetrate the second mold structure MO2. The first and second channel holes CH and CH2 and the first and second dummy holes DH1 and DH2 at least partially penetrating the second mold structure MO2 may be respectively overlapped with the first and second channel holes CH1 and CH2 and the first and second dummy holes DH1 and DH2 at least partially penetrating the first mold structure MO1, in a plan view.

The second sacrificial mask layer SAL2 may be exposed through the first and second channel holes CH1 and CH2 and the first and second dummy holes DH1 and DH2 at least partially penetrating the second mold structure MO2. The exposed second sacrificial mask layer SAL2 may be selectively removed to form the first and second channel holes CH1 and CH2 and the first and second dummy holes DH1 and DH2 at least partially penetrating the mold structure MO.

According to an embodiment of the inventive concept, the afore-described expanded holes EXH1-EXH4 may have diameters larger than holes thereunder. Since the expanded holes have relatively large areas, the holes at least partially penetrating the second mold structure MO2 may be more easily aligned to the expanded holes, respectively. As a result, when the holes at least partially penetrating the second mold structure MO2 are formed, it may be possible to prevent them from being misaligned to the holes formed in the first mold structure MO1. Since a process defect such as the aforementioned misalignment is prevented, the reliability of the semiconductor memory device may be increased.

Figure 14A:
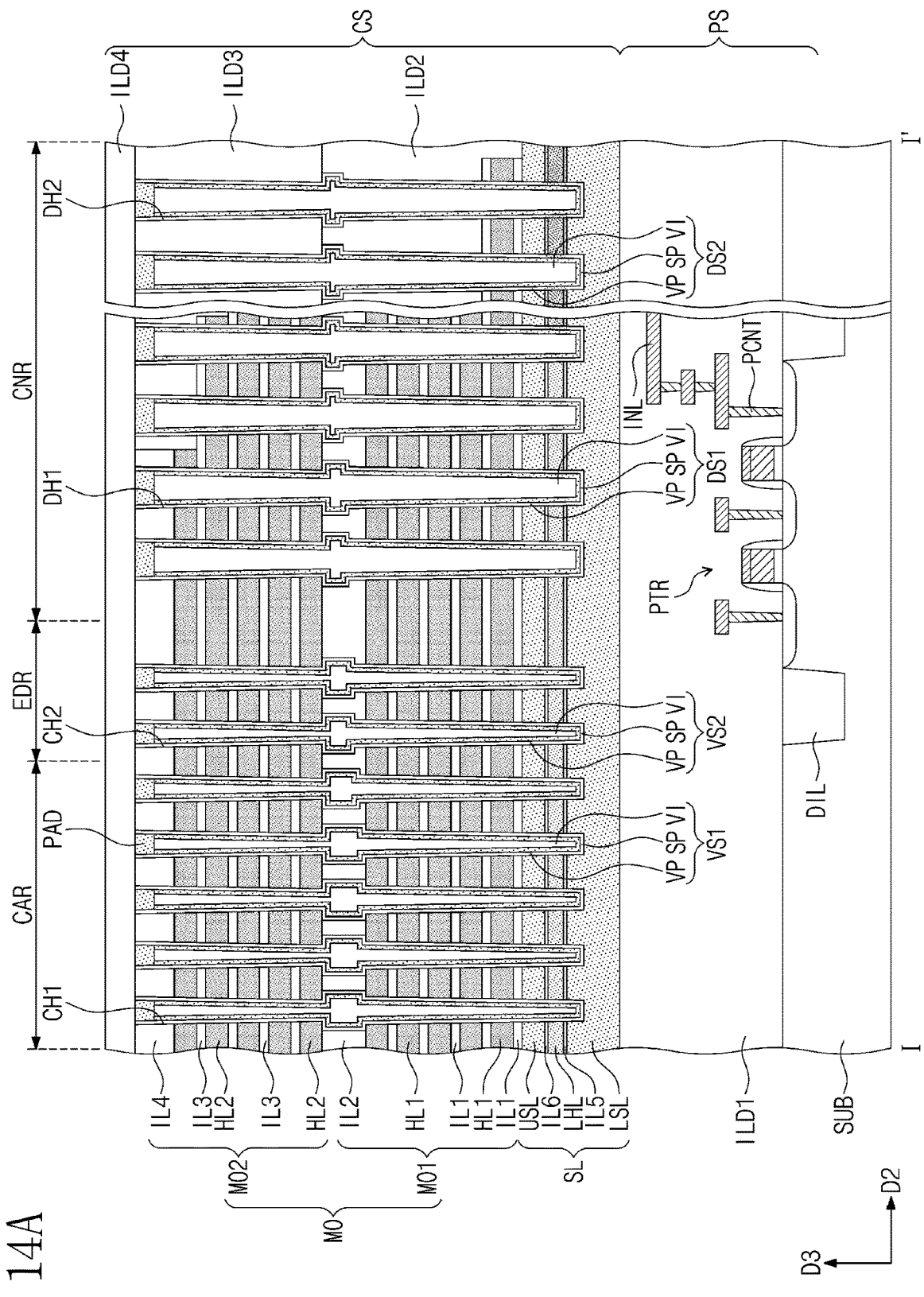
Figure 14B:
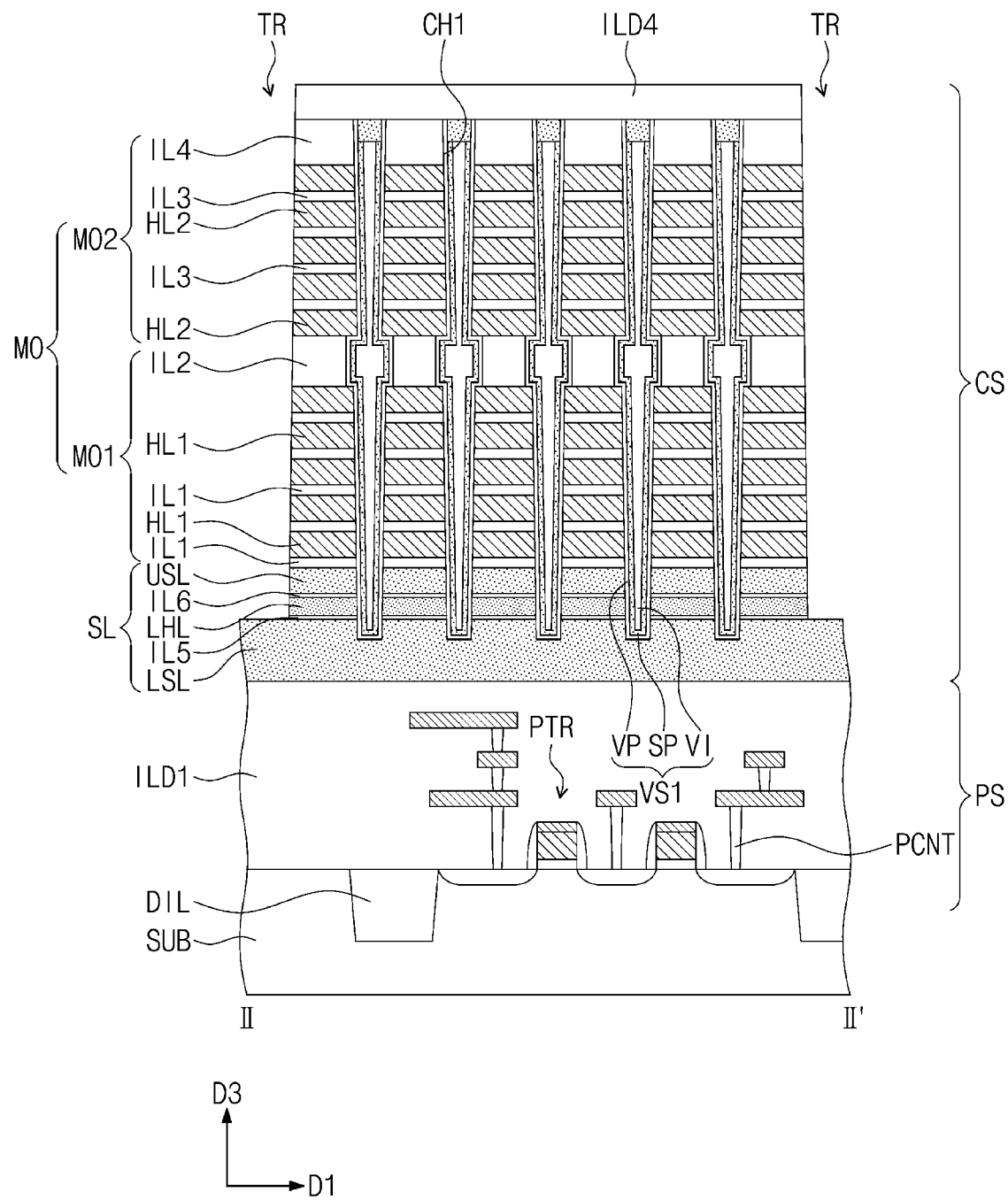

Referring to FIGS. 3, 14A, and 14B, the first and second vertical channel structures VS1 and VS2 may be formed in the first and second channel holes CH1 and CH2, respectively. The formation of the first and second vertical channel structures VS1 and VS2 may include sequentially forming the vertical insulating pattern VP, the vertical semiconductor pattern SP, and the gapfill insulating pattern VI on inner surfaces of the first and second channel holes C1 and CH2. The vertical insulating pattern VP and the vertical semiconductor pattern SP may be conformally formed.

The first and second dummy structures DS1 and DS2 may be formed in the first and second dummy holes DH1 and DH2, respectively. In an embodiment, the first and second dummy structures DS1 and DS2 may be formed concurrently with the first and second vertical channel structures VS1 and VS2. The conductive pad may be formed in or on an upper portion of each of the first and second vertical channel structures VS1 and VS2 and the first and second dummy structures DS1 and DS2.

The fourth interlayer insulating layer ILD4 may be formed on the mold structure MO. The mold structure MO may be patterned to form the trenches TR at least partially penetrating the mold structure MO. The trenches TR may be extended in the second direction D2 parallel to each other (e.g., see FIG. 3). The trench TR may expose the lower semiconductor layer LSL. The trench TR may expose sidewalls of the first and second sacrificial layers HL1 and HL2. The trench TR may expose side surfaces of the fifth insulating layer IL5, the lower sacrificial layer LHL, and the sixth insulating layer IL6.

Figure 15A:
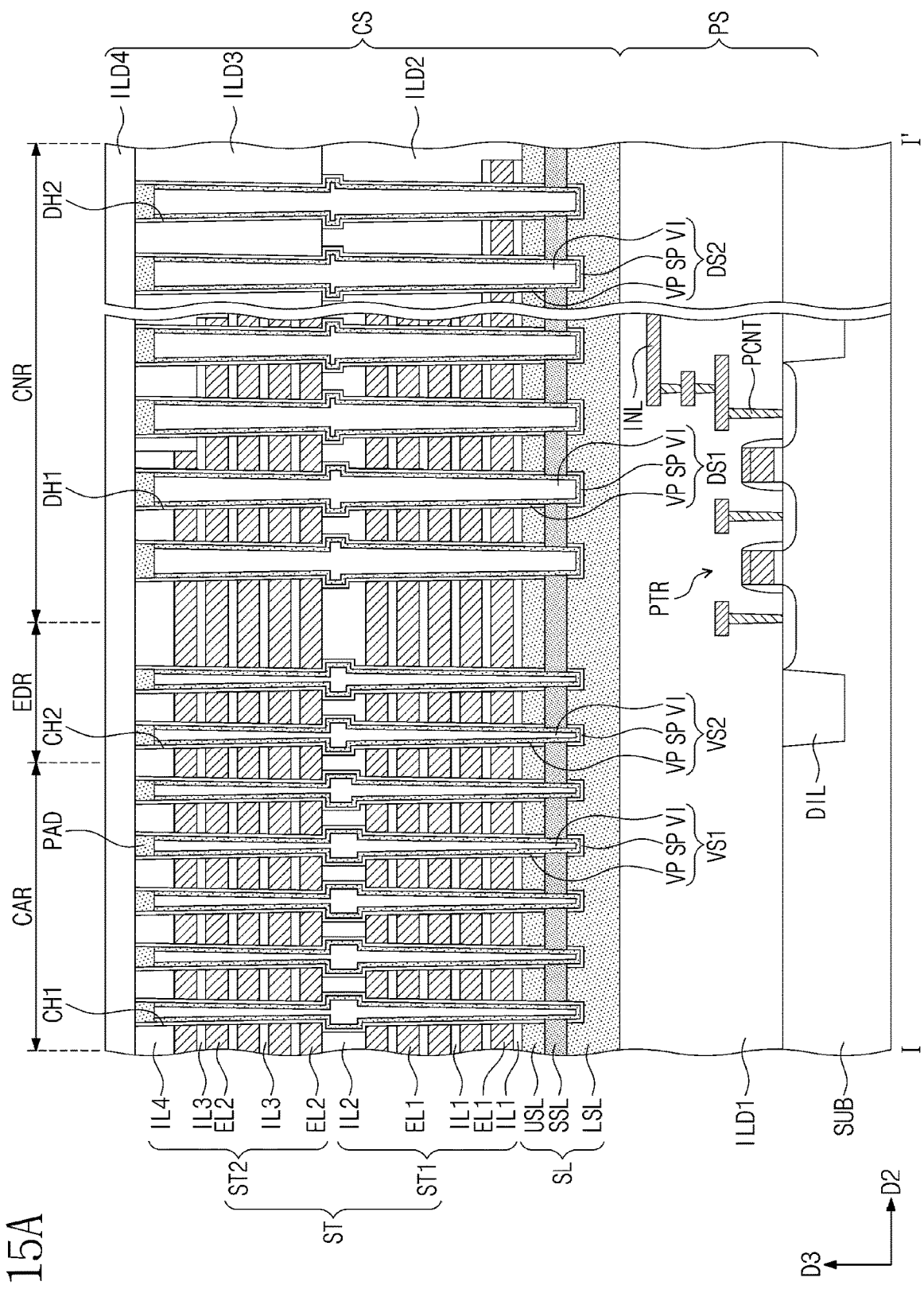
Figure 15B:
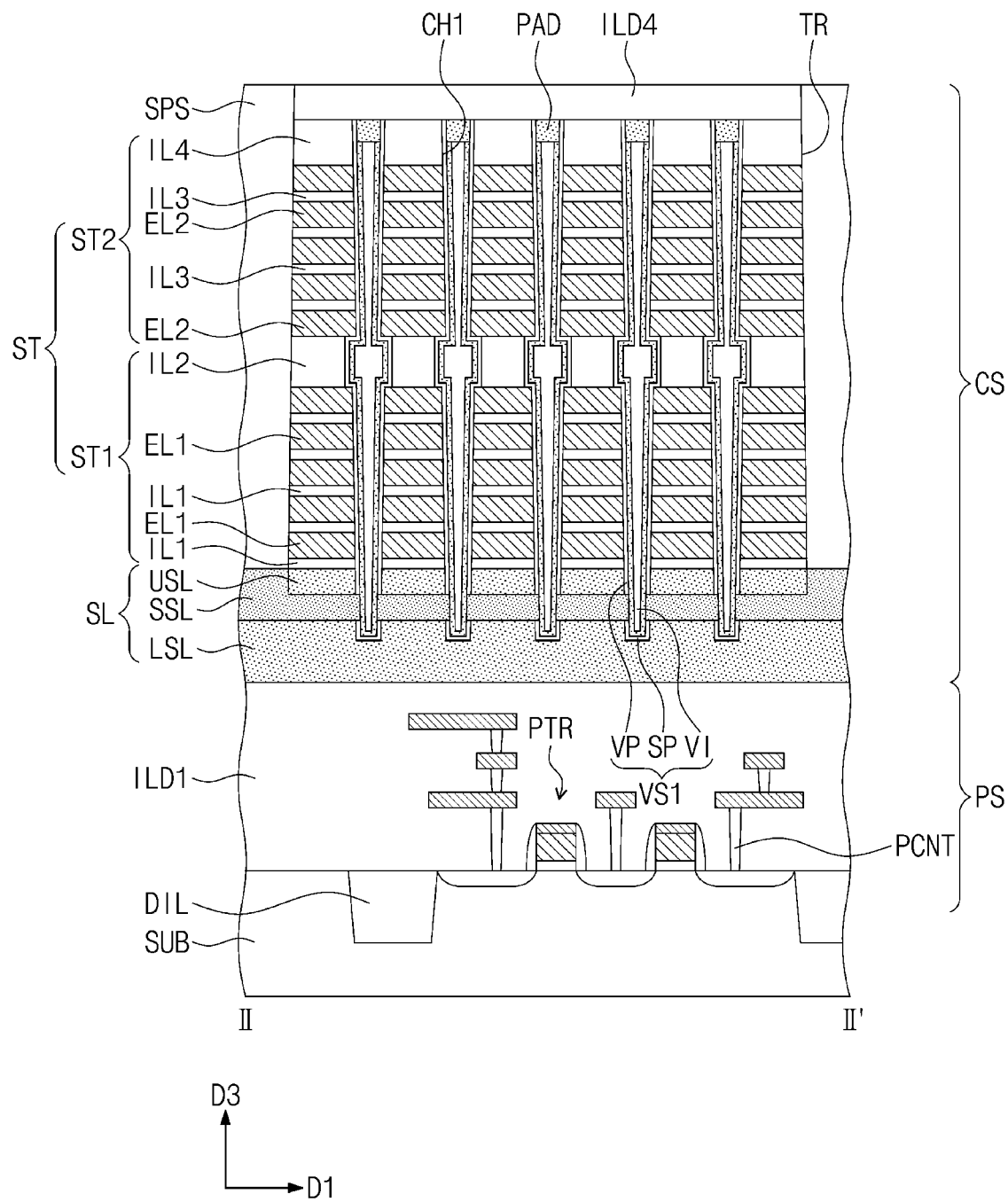

Referring to FIGS. 3, 15A, and 15B, the lower sacrificial layer LHL exposed by the trenches TR may be replaced with the source semiconductor layer SSL. For example, the lower sacrificial layer LHL exposed by the trenches TR may be selectively removed. As a result of the removal of the lower sacrificial layer LHL, a lower portion of the vertical insulating pattern VP of each of the first and second vertical channel structures VS1 and VS2 may be exposed.

The exposed lower portion of the vertical insulating pattern VP may be selectively removed. Accordingly, a lower portion of the vertical semiconductor pattern SP may be exposed. In an embodiment, the fifth insulating layer IL5 and the sixth insulating layer IL6 may be removed during removing the lower portion of the vertical insulating pattern VP.

The source semiconductor layer SSL may be formed in a space formed by removing the fifth insulating layer IL5, the lower sacrificial layer LHL, and the sixth insulating layer IL6. The source semiconductor layer SSL may be in direct contact with the exposed lower portion of the vertical semiconductor pattern SP. The source semiconductor layer SSL may be in direct contact with the lower semiconductor layer LSL thereunder. The source semiconductor layer SSL may be in direct contact with the upper semiconductor layer USL thereon. The lower semiconductor layer LSL, the source semiconductor layer SSL, and the upper semiconductor layer USL may constitute the second substrate SL.

The electrode structure ST may be formed by replacing the first and second sacrificial layers HL1 and HL2, which are exposed through the trenches TR, with the first and second electrodes EL1 and EL2. For example, the first and second sacrificial layers HL1 and HL2 exposed through the trenches TR may be selectively removed. The first and second electrodes EL1 and EL2 may be respectively formed in spaces, which are formed by removing the first and second sacrificial layers HL1 and HL2. The separation structures SPS may fill the trenches TR, respectively.

Referring back to FIGS. 3, 4A, and 4B, the bit line contact plugs BPLG, which are respectively coupled to the conductive pads PAD, may at least partially penetrate the fourth interlayer insulating layer ILD4. The cell contact plugs PLG, which are respectively coupled to the first and second electrodes EL1 and EL2, may at least partially penetrate the second to fourth interlayer insulating layers ILD2, ILD3, and ILD4. The bit lines BL electrically connected to the bit line contact plugs BPLG and the upper interconnection lines UIL electrically connected to the cell contact plugs PLG may be formed on the fourth interlayer insulating layer ILD4.

Figure 16A:
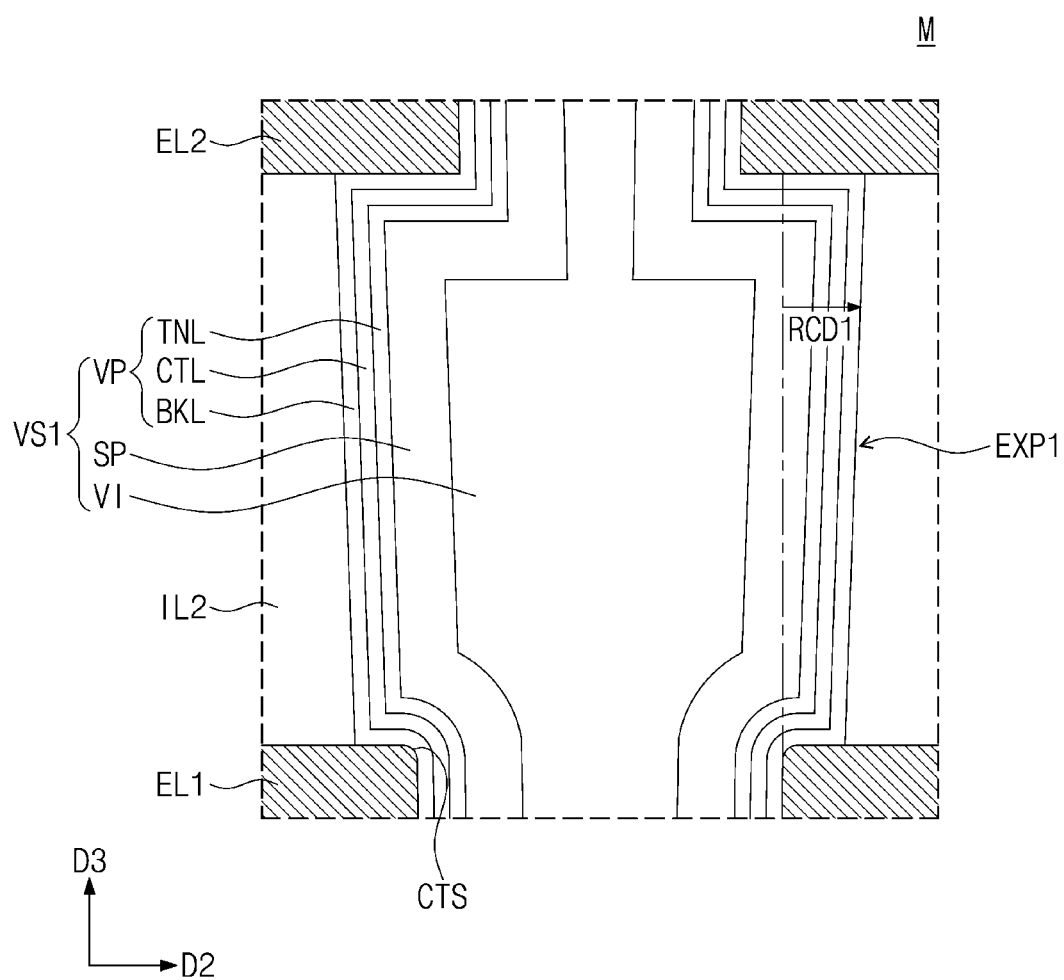

FIGS. 16A and 16B are enlarged cross-sectional views illustrating portions (e.g., the portions 'M' and 'N' of FIG. 4A) of a semiconductor memory device according to an embodiment of the inventive concept. For concise description, an element previously described with reference to FIGS. 3, 4A, 4B, 5A, and 5B will be identified by the same reference number without repeating an overlapping description thereof, and features different from that of the previous embodiment will be described in more detail below. Thus, to the extent that a detailed description of a particular element has been omitted, it may be assumed that this element is at least similar to corresponding elements that have been described elsewhere in the instant specification.

Referring to FIGS. 4A, 16A, and 16B, the topmost one of the first electrodes EL1, which is in contact with the first expanded portion EXP1, may have a curved surface CTS. The curved surface CTS may be in direct contact with a lower portion of the first expanded portion EXP1. The curved surface CTS of the topmost one of the first electrodes EL1 may be formed by etching a portion of the exposed surface of the topmost one of the first sacrificial layers HL, during the process of expanding the first channel hole CH1 previously described with reference to FIGS. 3, 11A, and 11B.

The first expanded portion EXP1 may be horizontally expanded from the first vertical extended portion VEP1 by the first recess distance RCD1 (e.g., see FIG. 16A). The fourth expanded portion EXP4 may be horizontally expanded from the first vertical extended portion VEP1 by the second recess distance RCD2 (e.g., see FIG. 16B). The second recess distance RCD2 may be greater than the first recess distance RCD1. The first expanded portion EXP1 may be formed by horizontally recessing the second insulating layer IL2, and the fourth expanded portion EXP4 may be formed by horizontally recessing the second interlayer insulating layer ILD2. Since the second insulating layer 112 and the second interlayer insulating layer ILD2 have different properties from each other, the recess depth of the second interlayer insulating layer ILD2 may be greater than that of the second insulating layer IL2.

Figure 17:
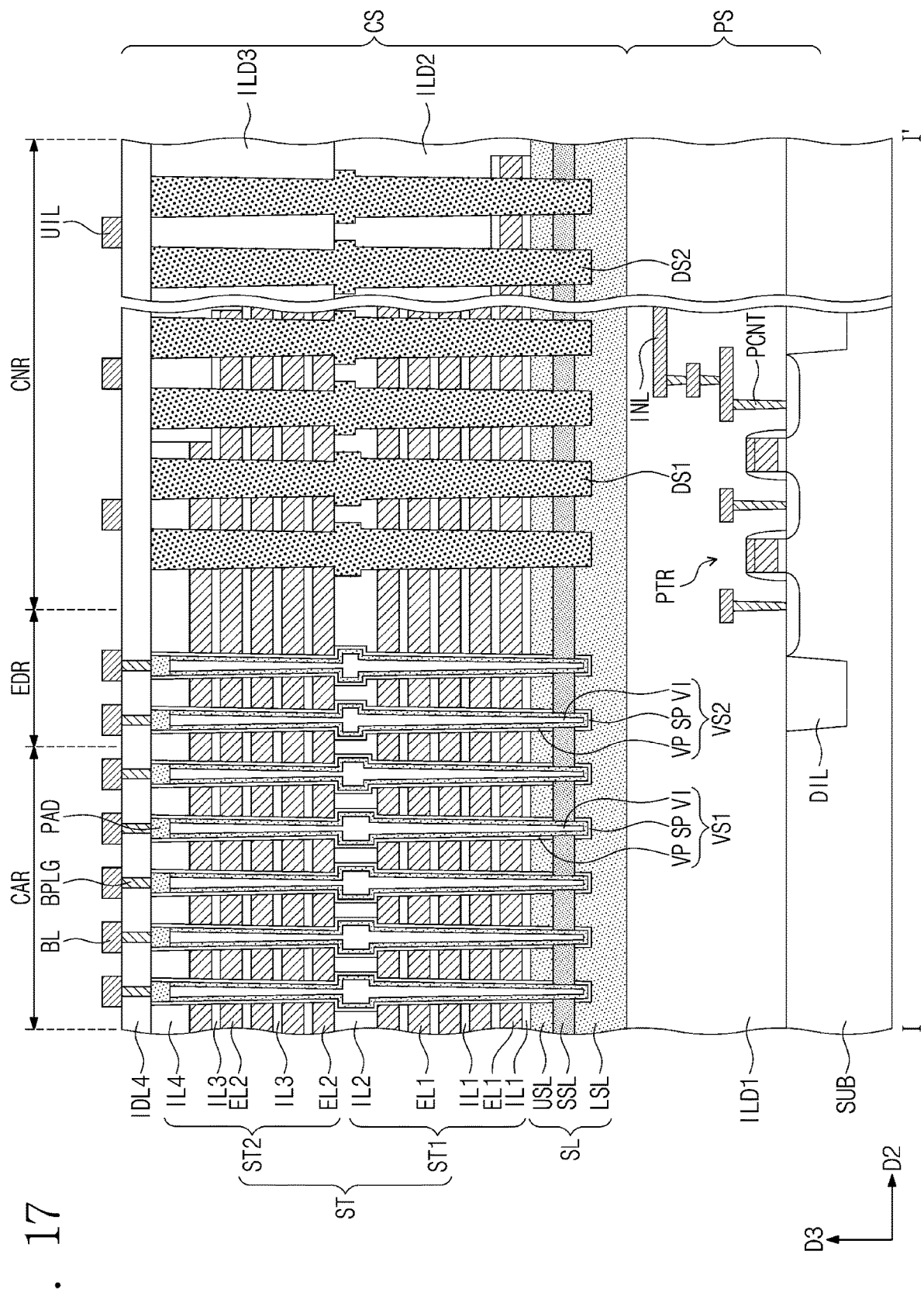
FIG. 17 is a cross-sectional view, which is taken along a line I-I' of FIG. 3 to illustrate a semiconductor memory device according to an embodiment of the inventive concept.

FIG. 17 is a cross-sectional view, which is taken along a line I-I' of FIG. 3 to illustrate a semiconductor memory device according to an embodiment of the inventive concept. For concise description, an element previously described with reference to FIGS. 3, 4A, 4B, 5A, and 5B will be identified by the same reference number without repeating an overlapping description thereof, and features different from that of the previous embodiment will be described in more detail below. Thus, to the extent that a detailed description of a particular element has been omitted, it may be assumed that this element is at least similar to corresponding elements that have been described elsewhere in the instant specification.

Referring to FIGS. 3 and 17, the first and second vertical channel structures VS1 and VS2 may be different from the first and second dummy structures DS1 and DS2 in terms of film or material properties. Each of the first and second vertical channel structures VS1 and VS2 may include the vertical insulating pattern VP, the vertical semiconductor pattern SP, and the gapfill insulating pattern VI. Each of the first and second dummy structures DS1 and DS2 may be formed of or may otherwise include insulating materials.

Figure 18:
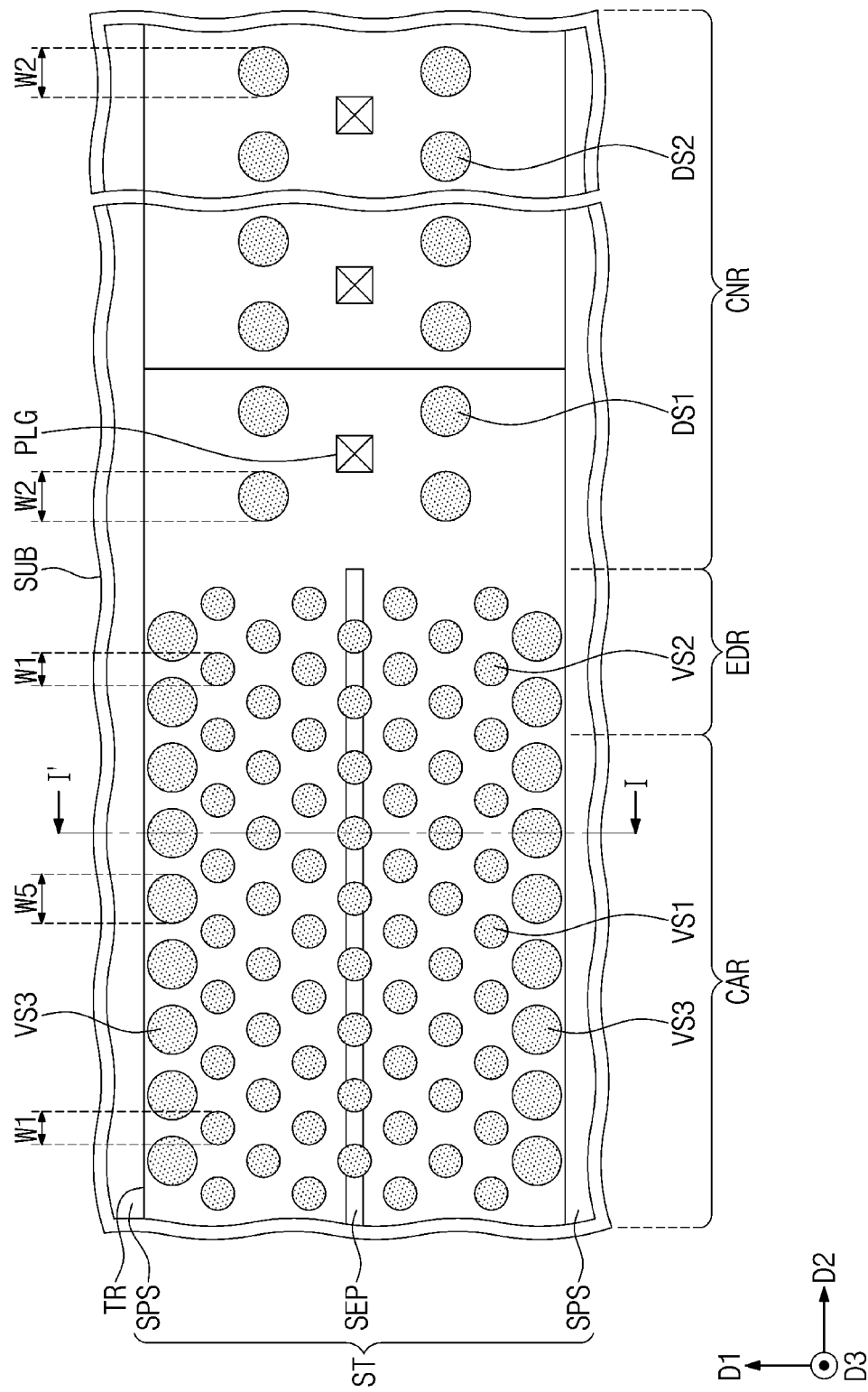
FIG. 18 is a plan view illustrating a three-dimensional semiconductor memory device according to an embodiment of the inventive concept.
Figure 19:
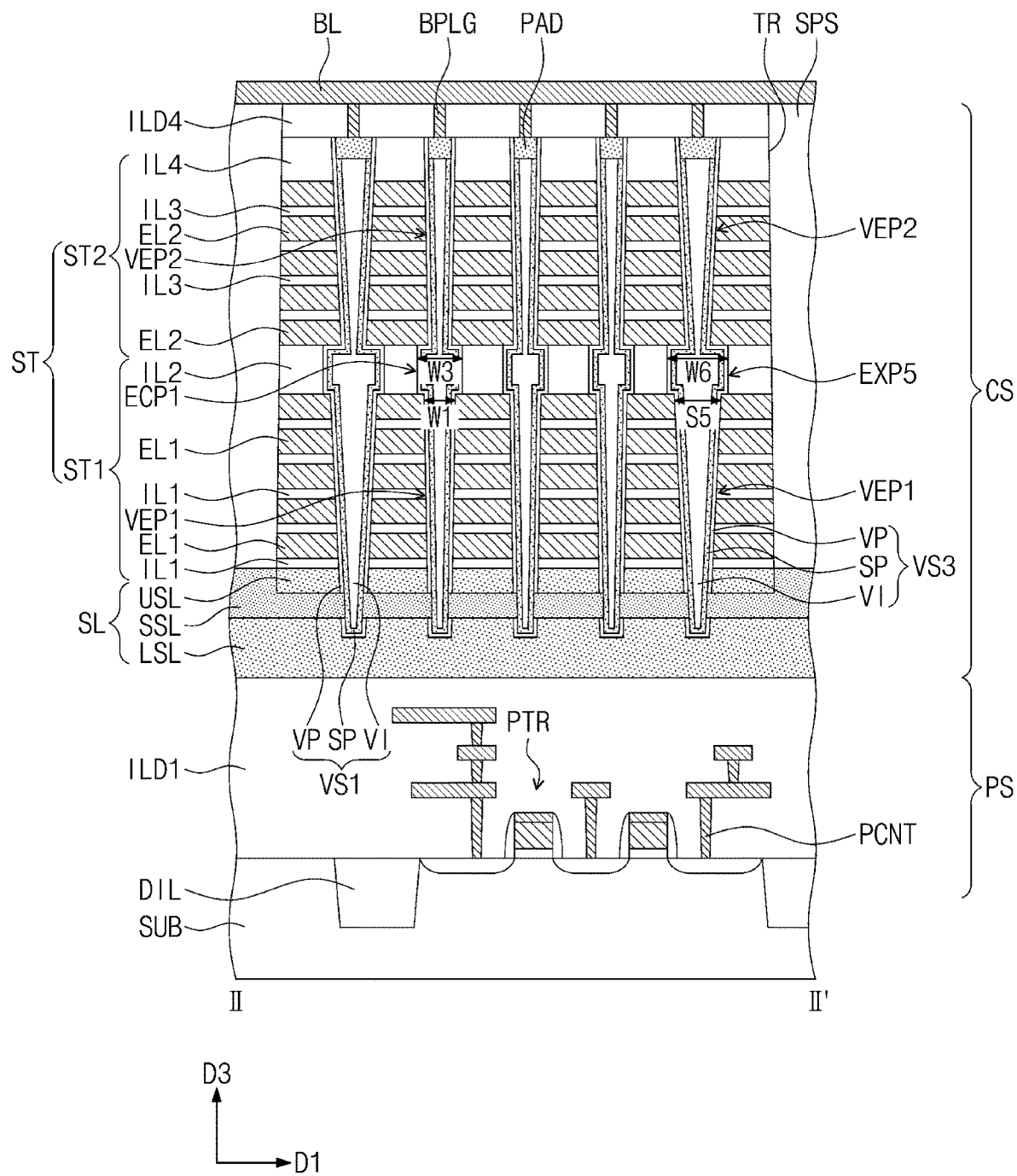
FIG. 19 is a cross-sectional view taken along a line I-I' of FIG. 18.

FIG. 18 is a plan view illustrating a three-dimensional semiconductor memory device according to an embodiment of the inventive concept. FIG. 19 is a cross-sectional view taken along a line I-I' of FIG. 18. For concise description, an element previously described with reference to FIGS. 3, 4A, 4B, 5A, and 5B will be identified by the same reference number without repeating an overlapping description thereof, and features different from that of the previous embodiment will be described in more detail below. Thus, to the extent that a detailed description of a particular element has been omitted, it may be assumed that this element is at least similar to corresponding elements that have been described elsewhere in the instant specification.

Referring to FIGS. 18 and 19, ones of the first vertical channel structures VS1, which are adjacent to the separation structure SPS, may be defined as third vertical channel structures VS3. The third vertical channel structures VS3 may be arranged along the separation structure SPS and in the second direction D2.

Each of the third vertical channel structures VS3 may include the first vertical extended portion VEP1 at least partially penetrating the first electrode structure ST1, the second vertical extended portion VEP2 at least partially penetrating the second electrode structure ST2, and a fifth expanded portion EXP5 between the first and second vertical extended portions VEP1 and VEP2. The fifth expanded portion EXP5 may be provided in the second insulating layer 112.

An upper portion of the first vertical extended portion VEP1 of the third vertical channel structure VS3 may have a fifth width W5. The fifth width W5 may be greater than the first width W1. An upper portion of the fifth expanded portion EXP5 may have a sixth width W6. The sixth width W6 may be greater than the fifth width W5. A ratio W6/W5 of the sixth width W6 to the fifth width W5 in the third vertical channel structure VS3 may be smaller than the ratio W3/W1 of the third width W3 to the first width W in the first vertical channel structure VS1.

Figure 20:
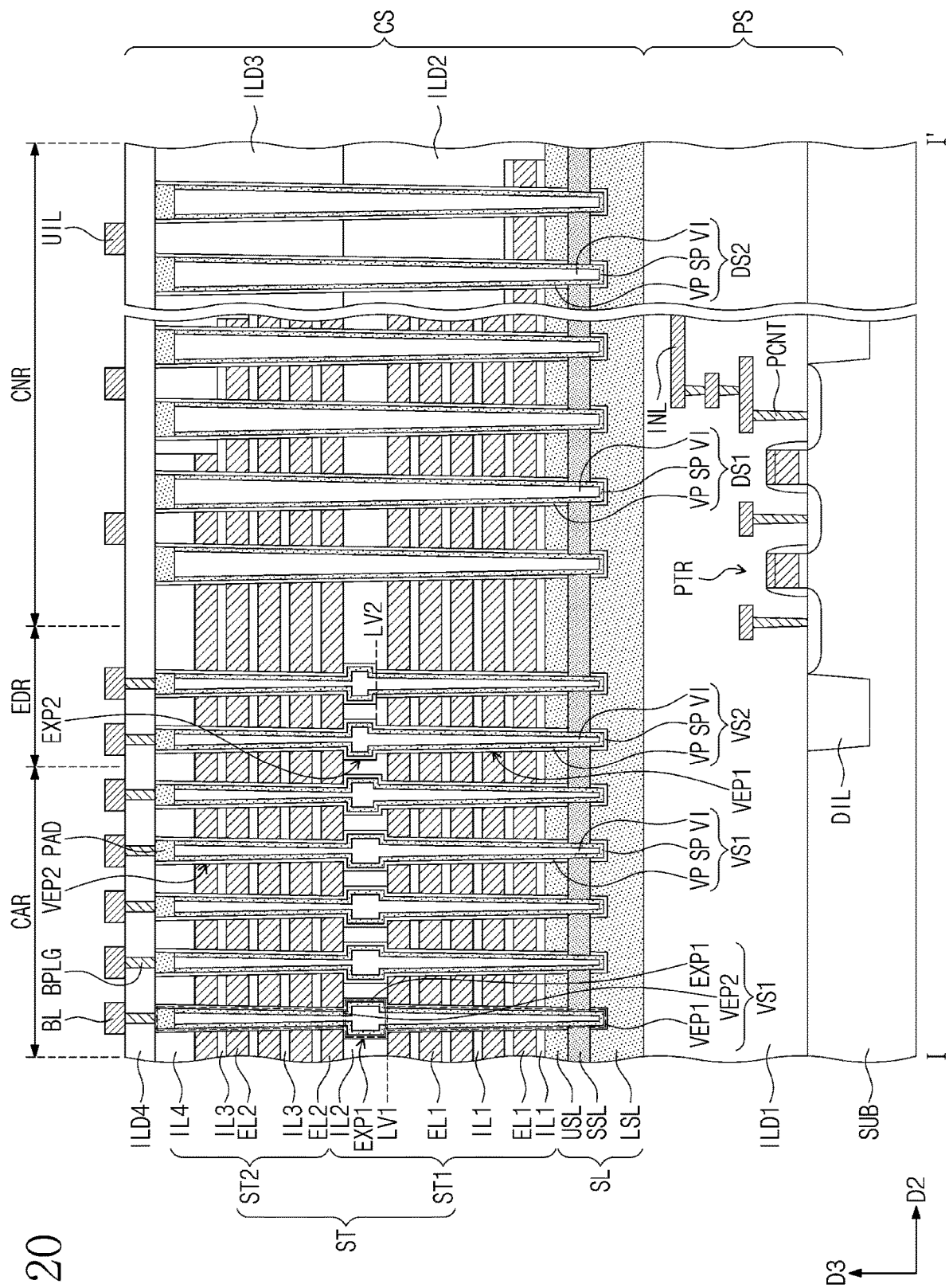
FIG. 20 is a cross-sectional view, which is taken along the line I-I' of FIG. 3, illustrating a three-dimensional semiconductor memory device according to another embodiment of the inventive concept.

FIG. 20 is a cross-sectional view, which is taken along the line I-I' of FIG. 3 to illustrate a three-dimensional semiconductor memory device according to another embodiment of the inventive concept. For concise description, an element previously described with reference to FIGS. 3, 4A, 4B, 5A, and 5B will be identified by the same reference number without repeating an overlapping description thereof, and features different from that of the previous embodiment will be described in more detail below. Thus, to the extent that a detailed description of a particular element has been omitted, it may be assumed that this element is at least similar to corresponding elements that have been described elsewhere in the instant specification.

Referring to FIG. 20, the first and second dummy structures DS1 and DS2 on the connection region CNR might not include the expanded portion. For example, the first dummy structure DS1 might not include the third expanded portion EXP3 previously described with reference to FIG. 4A. The second dummy structure DS2 might not include the fourth expanded portion EXP4 previously described with reference to FIG. 4A. The first and second dummy structures DS1 and DS2 may be provided to have widths or diameters gradually decreasing with decreasing distance to the second substrate SL.

By contrast, the first and second vertical channel structures VS1 and VS2, which are provided on the cell array region CAR and the cell edge region EDR, may include first and second expanded portions EXP1 and EXP2, respectively.

The formation of the first and second dummy structures DS1 and DS2 may include forming dummy holes on the connection region CNR through a single etching process, after the formation of the first and second mold structures MO1 and MO2 and the first and second channel holes CH1 and CH2 described in the afore-described fabrication method.

Figure 21:
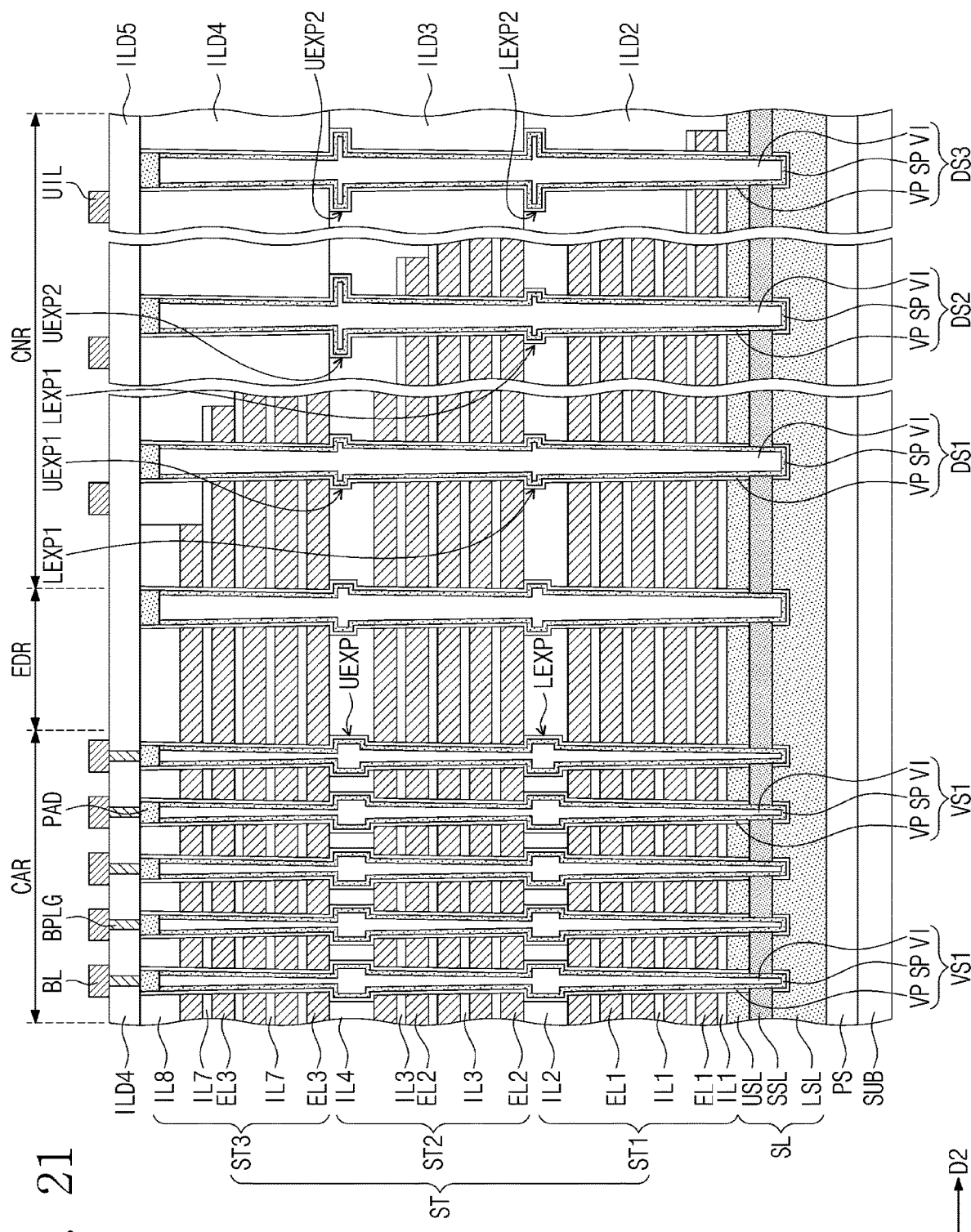
FIG. 21 is a cross-sectional view illustrating a three-dimensional semiconductor memory device according to embodiments of the inventive concept.

FIG. 21 is a cross-sectional view illustrating a three-dimensional semiconductor memory device according to embodiments of the inventive concept. For concise description, an element previously described with reference to FIGS. 3, 4A, 4B, 5A, and 5B will be identified by the same reference number without repeating an overlapping description thereof, and features different from that of the previous embodiment will be described in more detail below. Thus, to the extent that a detailed description of a particular element has been omitted, it may be assumed that this element is at least similar to corresponding elements that have been described elsewhere in the instant specification.

Referring to FIG. 21, the electrode structure ST may further include a third electrode structure ST3 provided on the second electrode structure ST2. The third electrode structure ST3 may include third electrodes EL3, which are stacked on the second electrode structure ST2 in the third direction D3. The third electrode structure ST3 may further include seventh insulating layers IL7, which separate the third electrodes EL3 from each other. An eighth insulating layer IL8 may be provided at the topmost portion of the third electrode structure ST3.

Each of the first and second vertical channel structures VS1 and VS2 may include a lower expanded portion LEXP, which is disposed in the second insulating layer IL2 of the first electrode structure ST1, and an upper expanded portion UEXP, which is disposed in the fourth insulating layer IL4 of the second electrode structure ST2.

The first dummy structure DS1, the second dummy structure DS2, and a third dummy structure DS3 may be provided on the connection region CNR. The first dummy structure DS1 may be adjacent to the cell edge region EDR. The third dummy structure DS3 may be adjacent to an end portion of the staircase structure of the electrode structure ST. The second dummy structure DS2 may be disposed between the first dummy structure DS1 and the third dummy structure DS3.

The first dummy structure DS1 may include a first lower expanded portion LEXP1, which is disposed in the second insulating layer IL2 of the first electrode structure ST1, and a first upper expanded portion UEXP1, which is disposed in the fourth insulating layer IL4 of the second electrode structure ST2.

The second dummy structure DS2 may include the first lower expanded portion LEXP1, which is disposed in the second insulating layer IL2 of the first electrode structure ST1, and a second upper expanded portion UEXP2, which is disposed in the upper portion of the third interlayer insulating layer ILD3.

The second upper expanded portion UEXP2 of the second dummy structure DS2 may have a width that is greater than the first lower expanded portion LEXP1 of the second dummy structure DS2. For example, the second recess distance RCD2 of the first lower expanded portion LEXP1 may be relatively small, as previously described with reference to FIG. 5B. The second recess distance RCD2 of the second upper expanded portion UEXP2 may be relatively large, as previously described with reference to FIG. 16B.

The first lower expanded portion LEXP1 may be formed by horizontally recessing the second insulating layer IL2 of the first electrode structure ST1, and the second upper expanded portion UEXP2 may be formed by horizontally recessing the third interlayer insulating layer ILD3. Since the second insulating layer IL2 and the third interlayer insulating layer ILD3 have different properties from each other, the second upper expanded portion UEXP2 of the second dummy structure DS2 may have a width that is larger than the first lower expanded portion LEXP1 therebelow.

The third dummy structure DS3 may include a second lower expanded portion LEXP2, which is disposed in the upper portion of the second interlayer insulating layer ILD2, and a second upper expanded portion UEXP2, which is disposed in the upper portion of the third interlayer insulating layer ILD3. Both of the second lower expanded portion LEXP2 and the second upper expanded portion UEXP2 of the third dummy structure DS3 may have relatively large widths.

According to an embodiment of the inventive concept, a vertical channel structure on a cell region may include an expanded portion disposed between a first vertical extended portion and a second vertical extended portion. Due to the presence of the expanded portion, it may be possible to increase reliability and support electric characteristics of a semiconductor memory device.

While example embodiments of the inventive concept have been particularly shown and described, it will be understood by one of ordinary skill in the art that variations in form and detail may be made therein without departing from the spirit and scope of the instant specification.

What is claimed is:

1. A semiconductor memory device, comprising:
a substrate including a cell region and a connection region;
an electrode structure disposed on the substrate, the electrode structure having a staircase structure on the connection region;
a first vertical channel structure at least partially penetrating the electrode structure on the cell region; and
a first dummy structure at least partially penetrating the electrode structure on the connection region,
wherein the electrode structure comprises:
a first electrode structure including a plurality of first electrodes, which are stacked on the substrate; and
a second electrode structure including a plurality of second electrodes, which are stacked on the first electrode structure,
wherein each of the first vertical channel structure and the first dummy structure comprises:
a first vertical extended portion at least partially penetrating the first electrode structure;
a second vertical extended portion at least partially penetrating the second electrode structure; and
an expanded portion disposed between the first and second vertical extended portions,
wherein a first height from a top surface of an uppermost one of the plurality of first electrodes to a bottom of the expanded portion of the first vertical channel structure is smaller than a second height from the top surface of the uppermost one of the plurality of first electrodes to a bottom of the expanded portion of the first dummy structure.

2. The semiconductor memory device of claim 1, wherein the substrate further comprises a cell edge region disposed between the cell region and the connection region,
wherein the semiconductor memory device further comprises a second vertical channel structure at least partially penetrating the electrode structure on the cell edge region,
wherein a third height from the top surface of the uppermost one of the plurality of first electrodes to a bottom of an expanded portion of the second vertical channel structure is greater than the first height and smaller than the second height.

3. The semiconductor memory device of claim 1, further comprising a second dummy structure at least partially penetrating the electrode structure on the connection region, wherein a distance between the second dummy structure and the cell region is greater than a distance between the first dummy structure and the cell region, and and wherein a fourth height from the top surface of the uppermost one of the plurality of first electrodes to a bottom of an expanded portion of the second dummy structure is greater than the second height.

4. The semiconductor memory device of claim 1, wherein a largest width of the first vertical extended portion of the first vertical channel structure is a first width, wherein a largest width of the expanded portion of the first vertical channel structure is a third width, wherein a largest width of the first vertical extended portion of the first dummy structure is a second width, wherein a largest width of the expanded portion of the first dummy structure is a fourth width, and wherein a ratio of the third width to the first width is greater than a ratio of the fourth width to the second width.

5. The semiconductor memory device of claim 4, wherein the expanded portion of the first vertical channel structure extends horizontally from the first vertical extended portion of the first vertical channel structure by a first distance, wherein the expanded portion of the first dummy structure extends horizontally from the first vertical extended portion of the first dummy structure by a second distance, and wherein the second distance is greater than the first distance.

6. The semiconductor memory device of claim 1, wherein the first electrode structure comprises an insulating layer on a topmost one of the plurality of first electrodes, and wherein a top surface of the expanded portion of the first vertical channel structure and a top surface of the expanded portion of the first dummy structure are each coplanar with a top surface of the insulating layer.

7. The semiconductor memory device of claim 1, wherein an upper portion of a topmost one of the plurality of first electrodes has a curved surface, and wherein the expanded portion of the first vertical channel structure is in contact with the curved surface.

8. The semiconductor memory device of claim 1, wherein the expanded portion of the first vertical channel structure extends horizontally from the first vertical extended portion of the first vertical channel structure by a first distance, wherein the expanded portion of the first dummy structure extends horizontally from the first vertical extended portion of the first dummy structure by a second distance, and wherein the second distance is greater than the first distance.

9. The semiconductor memory device of claim 1, further comprising:

a separation structure at least partially penetrating the electrode structure and extending in a specific direction, the separation structure horizontally dividing the electrode structure; and a second vertical channel structure at least partially penetrating the electrode structure and being adjacent to the separation structure, wherein a largest width of the first vertical extended portion of the first vertical channel structure is a first width, wherein a largest width of the expanded portion of the first vertical channel structure is a third width, wherein a largest width of a first vertical extended portion of the second vertical channel structure is a second width, wherein a largest width of an expanded portion of the second vertical channel structure is a fourth width, and wherein a ratio of the third width to the first width is greater than a ratio of the fourth width to the second width.

10. The semiconductor memory device of claim 1, wherein the substrate comprises a first substrate and a second substrate disposed on the first substrate, wherein the semiconductor memory device further comprises a peripheral circuit structure interposed between the first substrate and the second substrate, and wherein the electrode structure is provided on the second substrate, such that the first vertical channel structure is connected to the second substrate.

11. The semiconductor memory device of claim 1, wherein each of the first vertical channel structure and the first dummy structure comprises:

a semiconductor pattern; and a vertical insulating pattern interposed between the vertical semiconductor pattern and the electrode structure, wherein the vertical insulating pattern of the first vertical channel structure comprises a data storing layer.

12. A semiconductor memory device, comprising:

a substrate including a cell region, a connection region, and a cell edge region disposed between the cell region and the connection region;

an electrode structure disposed on the substrate;

a first vertical channel structure at least partially penetrating the electrode structure on the cell region; and a second vertical channel structure at least partially penetrating the electrode structure on the cell edge region, wherein the electrode structure comprises:

a first electrode structure including a plurality of first electrodes, which are stacked on the substrate; and a second electrode structure including a plurality of second electrodes, which are stacked on the first electrode structure, wherein each of the first and second vertical channel structures has:

a first vertical extended portion at least partially penetrating the first electrode structure;

a second vertical extended portion at least partially penetrating the second electrode structure; and an expanded portion disposed between the first and second vertical extended portions, wherein a vertical length of the expanded portion of the first vertical channel structure is greater than a vertical length of the expanded portion of the second vertical channel structure.

13. The semiconductor memory device of claim 12, further comprising a first dummy structure at least partially penetrating the electrode structure on the connection region, wherein the vertical length of the expanded portion of the second vertical channel structure is greater than a vertical length of an expanded portion of the first dummy structure.

14. The semiconductor memory device of claim 13, further comprising a second dummy structure at least partially penetrating the electrode structure on the connection region, wherein a distance between the second dummy structure and the cell region is greater than a distance between the first dummy structure and the cell region, and wherein the vertical length of the expanded portion of the first dummy structure is greater than a vertical length of an expanded portion of the second dummy structure.

15. The semiconductor memory device of claim 12, wherein the first electrode structure comprises an insulating layer on a topmost one of the plurality of first electrodes, and
wherein a top surface of the expanded portion of the first vertical channel structure and a top surface of the expanded portion of the second vertical channel structure are each coplanar with a top surface of the insulating layer.

16. The semiconductor memory device of claim 12, further comprising:
a separation structure at least partially penetrating the electrode structure and extending in a specific direction, the separation structure horizontally dividing the electrode structure; and
a third vertical channel structure at least partially penetrating the electrode structure on the cell region and being adjacent to the separation structure,
wherein a largest width of the first vertical extended portion of the first vertical channel structure is a first width,
wherein a largest width of the expanded portion of the first vertical channel structure is a third width,
wherein a largest width of a first vertical extended portion of the third vertical channel structure is a second width,
wherein a largest width of an expanded portion of the third vertical channel structure is a fourth width, and
wherein a ratio of the third width to the first width is greater than a ratio of the fourth width to the second width.

17. A semiconductor memory device, comprising:
a substrate including a cell region and a connection region;
an electrode structure disposed on the substrate, the electrode structure having a staircase structure on the connection region;
a first vertical channel structure at least partially penetrating the electrode structure on the cell region; and
a first dummy structure at least partially penetrating the electrode structure on the connection region,
wherein the electrode structure comprises:
a first electrode structure including a plurality of first electrodes, which are stacked on the substrate; and
a second electrode structure including a plurality of second electrodes, which are stacked on the first electrode structure,
wherein each of the first vertical channel structure and the first dummy structure has:
a first vertical extended portion at least partially penetrating the first electrode structure;
a second vertical extended portion at least partially penetrating the second electrode structure; and
an expanded portion disposed between the first and second vertical extended portions,
wherein a largest width of the first vertical extended portion of the first vertical channel structure is a first width,
wherein a largest width of the expanded portion of the first vertical channel structure is a third width,
wherein a largest width of the first vertical extended portion of the first dummy structure is a second width,
wherein a largest width of the expanded portion of the first dummy structure is a fourth width, and
wherein a ratio of the third width to the first width is greater than a ratio of the fourth width to the second width.

18. The semiconductor memory device of claim 17, wherein the substrate further comprises a cell edge region disposed between the cell region and the connection region,
wherein the semiconductor memory device comprises:
a second vertical channel structure at least partially penetrating the electrode structure on the cell edge region; and
a second dummy structure at least partially penetrating the electrode structure on the connection region,
wherein a distance between the second dummy structure and the cell region is greater than a distance between the first dummy structure and the cell region,
wherein a bottom of an expanded portion of the second vertical channel structure is higher than a bottom of the expanded portion of the first vertical channel structure,
wherein a bottom of the expanded portion of the first dummy structure is higher than a bottom of the expanded portion of the second vertical channel structure, and
wherein a bottom of an expanded portion of the second dummy structure is higher than a bottom of the expanded portion of the first dummy structure.

19. The semiconductor memory device of claim 18, wherein the first electrode structure comprises an insulating layer on a topmost one of the plurality of first electrodes, and
wherein top surfaces of the expanded portions of the first and second vertical channel structures and the first and second dummy structures are each coplanar with a top surface of the insulating layer.

20. The semiconductor memory device of claim 17, further comprising:
a separation structure at least partially penetrating the electrode structure and extending in a specific direction, the separation structure horizontally dividing the electrode structure; and
a second vertical channel structure at least partially penetrating the electrode structure and being adjacent to the separation structure,
wherein a largest width of a first vertical extended portion of the second vertical channel structure is a fifth width,
wherein a largest width of an expanded portion of the second vertical channel structure is a sixth width, and
wherein the ratio of the third width to the first width is greater than a ratio of the sixth width to the fifth width.

* * * * *